(12) United States Patent
Orava et al.

(10) Patent No.: US 6,856,350 B2
(45) Date of Patent: *Feb. 15, 2005

(54) SEMICONDUCTOR RADIATION IMAGING DEVICE INCLUDING THRESHOLD CIRCUITRY

(75) Inventors: Risto Olavi Orava, Helsinki (FI); Jouni Ilari Pyyhtia, Vantaa (FI); Tom Gunnar Schulman, Masaia (FI); Miltiadis Evangelos Sarakinos, Geneva (CH); Konstantinos Evangelos Spartiotis, Helsinki (FI)

(73) Assignee: Simage Oy, Espoo (FI)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 599 days.

(21) Appl. No.: 08/871,199

(22) Filed: Jun. 9, 1997

(65) Prior Publication Data

US 2001/0001562 A1 May 24, 2001

Related U.S. Application Data

(62) Division of application No. 08/454,789, filed on May 31, 1995, now Pat. No. 5,812,191.

(30) Foreign Application Priority Data

| Jun. 1, 1994 | (GB) | 9410973 |
| Oct. 21, 1994 | (GB) | 9421289 |
| Feb. 8, 1995 | (GB) | 9502419 |
| Apr. 24, 1995 | (GB) | 9508294 |

(51) Int. Cl.[7] .......... H04N 5/335; H01L 27/00
(52) U.S. Cl. .......... 348/308; 348/302; 348/297; 250/208.1
(58) Field of Search .......... 348/302, 308, 348/304, 254, 294, 297; 258/208.1, 208.2; 377/60; 378/98.8

(56) References Cited

U.S. PATENT DOCUMENTS

| 4,811,371 A | * | 3/1989 | Tower | 377/60 |
| 5,153,420 A | * | 10/1992 | Hack et al. | 250/208.1 |
| 5,379,336 A | * | 1/1995 | Kramer et al. | 378/98.8 |
| 5,387,933 A | * | 2/1995 | Fouilloy et al. | 348/297 |
| 5,401,952 A | * | 3/1995 | Sugawa | 348/308 |
| 5,406,332 A | * | 4/1995 | Shinohara et al. | 348/308 |
| 5,565,915 A | * | 10/1996 | Kindo et al. | 348/308 |
| 5,587,738 A | * | 12/1996 | Shinohara | 348/308 |

* cited by examiner

*Primary Examiner*—Wendy R. Garber
*Assistant Examiner*—Luong T. Nguyen
(74) *Attorney, Agent, or Firm*—Kenyon & Kenyon

(57) ABSTRACT

A semiconductor radiation imaging device includes an array of pixel cells having an array of pixel detectors which directly generate charge in response to incident radiation and a corresponding array of individually-addressable pixel circuits. Each pixel circuit is associated with a respective pixel detector for accumulating charge directly resulting from radiation incident on the pixel detector and includes threshold circuitry and charge accumulation circuitry. The threshold circuitry is configured to discard radiation hits on the pixel detector outside a predetermined threshold range, and the charge accumulation circuit is configured to accumulate charge directly resulting from a plurality of successive radiation hits on the respective pixel detector within the predetermined threshold range.

12 Claims, 14 Drawing Sheets

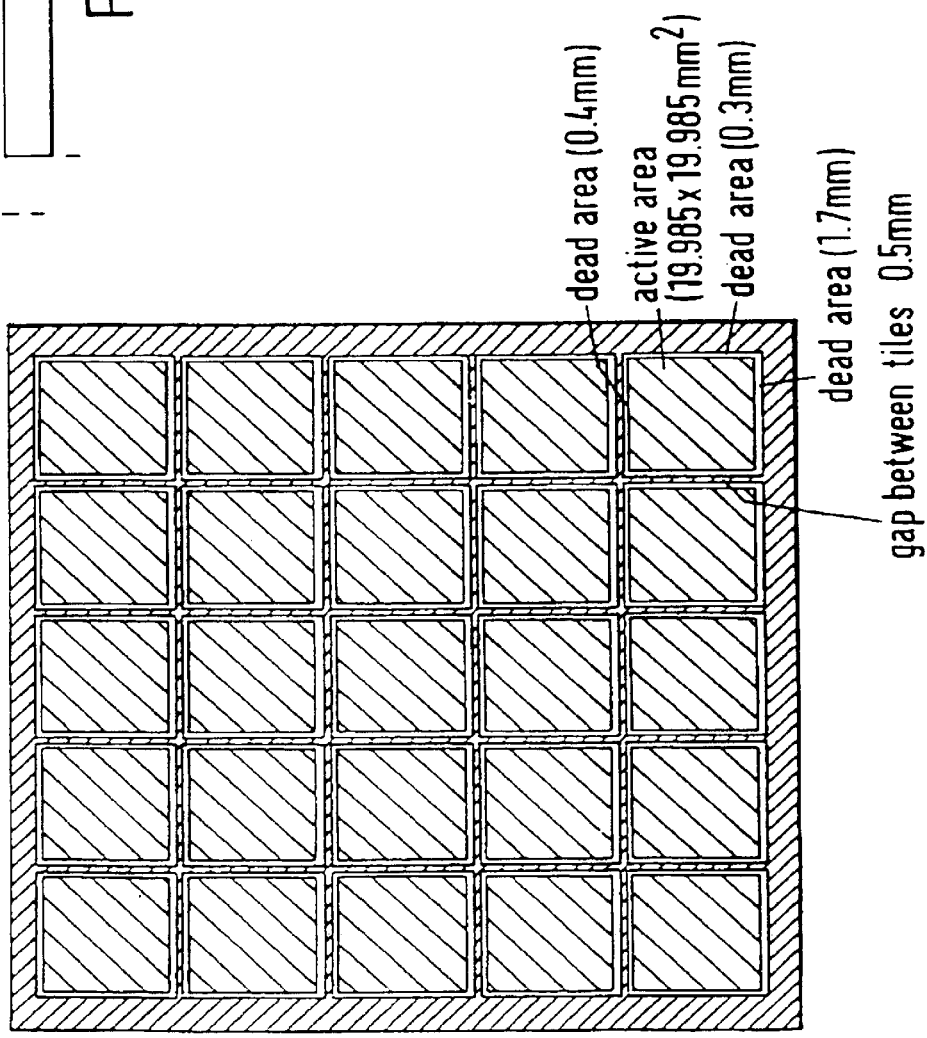
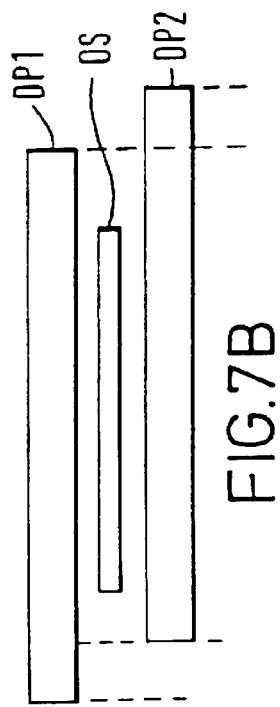
FIG.7A
FIG.7B
dead area (0.4mm)
active area (19.985 × 19.985 mm²)
dead area (0.3mm)
dead area (1.7mm)
gap between tiles 0.5mm dead spot (1.1mm x 2.6mm)

double detection
18.885mm x (17.385mm)

SEMICONDUCTOR RADIATION IMAGING DEVICE INCLUDING THRESHOLD CIRCUITRY

This is a division of application Ser. No. 08/454,789, filed May 31, 1995 now U.S. Pat. No. 5,812,191.

BACKGROUND OF THE INVENTION

1. Field of the Invention

The invention relates to imaging devices, systems and methods, and in particular to a semiconductor pixel imaging device for use as an image sensor and to imaging systems and methods utilizing the pixel semiconductor imaging device.

2. Description of the Prior Art

Two basic types of semiconductor pixel devices are known in the prior art:

1) Charge Coupled image sensors also known as Charge Coupled Devices (CCD) and
2) Pulse Counting Semiconductor Pixel Devices.

CCDs have been used for the past 15 years or so (see for example S. M Sze "Physics of Semiconductor Devices" 2nd Edition, 1981) as image sensors. Practically all CCDs available are made using silicon (Si) technology. The principle of operation of a CCD is based on the fact that when an appropriate voltage is applied via an electrode gate, the bulk Si volume becomes depleted of majority carriers (e.g. holes) and a region is created (depletion region) where electrons can be accumulated. This depletion region amounts to a potential well with a depth proportional to the applied voltage. The maximum charge that can then be stored in a CCD pixel depends on the area under the electrode, the voltage applied, the dark or leakage current coming from the bulk Si that continuously fills the well and the thickness of the oxide layer between the electrode and the bulk Si. These factors determine the effective CCD charge storing capacity.

When electrons are accumulated in the potential well and need to be read out, the potential at the electrode gates is pulsed and an electron package stored under one gate starts to be clocked towards the next gate and so on. The electron package never leaves the Si substrate and in order to read a stored charge at some pixel position the contents of all other pixels ahead of it have first to be read out in a sequential way. During this process no further charge can be accumulated as it would destroy the information of the charge content per pixel and consequently it would spoil image resolution and contrast. Therefore during readout the image sensor is inactive. The above described process requires at least three electrode gates per pixel.

CCDs can be used either for detecting, accumulating and reading out charge created from light and/or radiation or can be used just as a readout device for reading the charge created in another detecting means (e.g. photodiodes). When used for detecting incident radiation as well as for reading the signals, CCDs have an additional limitation of low efficiency.

In particular at high energies (X-rays above a few KeV) CCDs are used in conjunction with light converting screens that convert X-rays to optical light, to which a CCD is more sensitive. However light diffusion worsens resolution and contrast.

Therefore a CCD operates in the following way:

1) Charge is accumulated within a depletion region created by an applied voltage. For each pixel the depletion region has a potential well shape and constrains the electrons under the electrode gate to remain inside the Si bulk volume.

2) Voltages are pulsed to the electrode gates to clock each charge package to the volume corresponding to the next pixel. The charge package remains at all times inside the Si substrate and clocks its way through, pixel by pixel, to a common output. During that process additional charge cannot be accumulated.

As a result of the above the CCD is a device with two substantial limitations:

1) Compromised dynamic range. Typically a CCD can accumulate 100,000–700,000 electrons. The reason for the limited dynamic range is that the potential well fills up due to the dark current within the Si volume, the electrode gate surface under which the charge is accumulated is at best ⅓ of the total pixel area (thus not utilizing the total charge storage capacity of the pixel) and the oxide layer thickness upon which the storage capacity also depends has to be thick to stand the abrupt voltage pulses needed for the readout (note: the thicker the oxide layer, the less charge can be stored in the potential well).

2) Large inactive time. The inactive time needed for the readout is considerable. In many cases this inhibits CCDs from being used for fast dynamic multi-frame image accumulation.

Two examples of systems using CCDs are included in patent applications GB-A-2249430 and GB-A-2262383. Both applications are concerned with ways of overcoming the intrinsic CCD limitations.

Semiconductor pixel detectors comprise a semiconductor substrate with electrodes which apply a depletion voltage to each pixel and define a charge collection volume. Simple buffer circuits read out the electric signals when a photon is photo-absorbed or when ionizing radiation crosses the depletion zone of the semiconductor substrate. The buffer circuits can either be on the same substrate (compare EP-A-0,287,197) as the charge collection volumes or on a separate substrate (compare EP-A-0,571,135) that is mechanically bonded to a substrate having the charge collection volumes in accordance with, for example, the well known bump-bonding technique (bump-bonding is a technique known for a decade or more). These pixel detectors operate in a pulse mode. A pulse counting mode or simply pulse imaging can be implemented by either reading the pixels continuously or by reading pixels sequentially at a fast enough rate.

In either case, every time a charge is present as a result of a high energy ray or light, the aim is to read it out and process the information. The pixel detectors decrease the readout speed needed because there is a higher segmentation and more parallel readout channels. However, they cannot cope with high intensity applications because the readout electronics will overflow or counting ability saturates thus destroying the image contrast. In some of these devices simultaneously incident rays cause ambiguous and 'ghost' hits that cannot be resolved and worsen the resolution. Although these devices directly detect the incident radiation, they have limitations due to an operation based on a single pulse counting mode and imaging based on the counting of discrete points.

It will be appreciated from the above that all of the devices presently available have limitations which cannot be resolved. In particular CCDs enable charge from successive hits to be accumulated, but only to the limited extent possible within a potential well inside the Si substrate, which substantially limits the dynamic range. Also, because of the charge accumulation method, charge readout happens in a time sequence mode by clocking the pixel charge content to the neighbouring pixel storing unit (which is always the same Si substrate). Thus, until all pixels are read out as a time train sequence, a CCD cannot accumulate a new image frame since additional incoming radiation and/or light would not be recorded in one to one correspondence with a pixel position during the readout process. Therefore limited dynamic range and large inactive time during imaging are the two major CCD limitations.

On the other hand some semiconductor pixel devices have been proposed that directly read the pixel content every time a hit is detected. These devices operate on the single pulse counting mode and suffer from saturation problems at high counting rates. Such conventional single hit counting devices have a very small dynamic range.

SUMMARY OF THE INVENTION

Accordingly, an object of the invention is to provide an imaging device based on a different approach which enables the problems of the prior art to be mitigated and/or solved.

In accordance with an aspect of the invention there is provided an imaging device for imaging radiation, the imaging device comprising an array of pixel cells including a semiconductor substrate having an array of pixel detectors which generate charge in response to incident radiation and a corresponding array of pixel circuits, each pixel circuit being associated with a respective pixel detector for accumulating charge resulting from radiation incident on the pixel detector, the pixel circuits being individually addressable and comprising circuitry for accumulating charge from successive radiation hits on the respective pixel detectors.

The invention provides an imaging device which can be described as an Active-pixel Semiconductor Imaging Device (ASID). Embodiments of an imaging device in accordance with the invention are suitable, in particular, for high energy radiation imaging such as X-ray, β-ray and α-ray real time imaging. The invention is also applicable for imaging other types of radiation, including light for example.

An ASID is able actively to accumulate charge for individual pixels during irradiation. It directly detects rays incident on a pixel cell detector of the semiconductor substrate and accumulates charge (by accumulating the charge directly as charge values or by converting it to a voltage or current and accumulating the resulting voltage or current) in an active circuit corresponding to the pixel cell detector. By enabling the active circuit for each pixel to be addressed individually, that is independently of all other pixel circuits, (e.g., in random or sequential order), the stored charge can be read out at any time during or after irradiation.

In an embodiment of the invention therefore, charge is accumulated in charge-accumulating circuitry (e.g. the gate of an integrated transistor or an integrated capacitor). There is no need for and no use of the depletion layer and the potential well as in the case of a CCD. A charge storage device such as the gate of a FET or a capacitor can be optimized to cover substantially all of the pixel circuit area with a minimum thickness oxide layer. These two factors maximize the charge storage capacity which is, for example, two orders of magnitude greater than that of a CCD. Moreover, each pixel does not interfere with its neighbouring pixels. Independent access to pixels offers fast dynamic image frame accumulation not possible with CCDs.

An embodiment of the invention can also overcome the previous limitations of pulse counting pixel devices at high counting rates in that several hundreds or thousands of pulses can be accumulated prior to being read out. The number of readout channels is therefore diminished without compromising device performance.

The active circuit is preferably located proximate to the pixel detector (either integral to the semiconductor substrate comprising the pixel cell detectors or on a substrate bonded thereto) and has a sufficient dynamic range to accumulate charge corresponding to several hundreds or thousands of radiation hits on the corresponding pixel detector.

Readout of the active pixel circuits can be arranged to occur very rapidly and independently of all other pixel circuits, thus with practically no dead time, so that the active circuit and the corresponding pixel cell detector are ready immediately to continue accumulating radiation hits.

Each detecting element and the associated active circuit constitutes a randomly accessible, dynamic active imaging pixel capable of accumulating charge (either directly as charge or as a voltage or current equivalent) during radiation and capable of being read during or after irradiation. The content of each pixel is not transferred sequentially to the nearby pixel but is read out independently of all other pixels. The readout speed and the degree of parallel or sequential signal processing for the read out data can be optimized to match the radiation intensity and the time available to accumulate one image frame.

Accordingly, an imaging device in accordance with the invention can accumulate charge from successive radiation or light hits utilizing the large dynamic range of a transistor and/or a capacitor that is provided in one to one correspondence with a detecting pixel cell. Whereas CCDs make use of a depletion layer inside a Si substrate to store charge in a potential well, an ASID accumulates charge on the gate of a transistor and/or a capacitor. An ASID consequently will have a dynamic range up to two orders of magnitude larger than a CCD. The same charge accumulating pixel circuit elements also allow readout of each accumulated charge value in one to one correspondence with the detecting pixel element with practically no dead time during image frame accumulation. An ASID also reduces the limitations of conventional semiconductor pixel devices that operate in a pulse counting mode as imaging is performed in direct proportion to the total accumulated charge and not to the number of radiation hits. While conventional pulse counting pixel devices suffer from saturation at high counting rates, an ASID can accumulate hundreds or thousands of hits prior to being read out. Long charge accumulation times (from a few microseconds to about 1 second is possible) diminish the effect of resetting the pixel circuits. Thus the total inactive time of each pixel circuit is a very small fraction of the charge accumulation time (or active time).

The invention finds particular application for high intensity imaging applications. The problems of unrealistic readout speed, ambiguous and 'ghost' hits of prior pixel detectors and the low efficiency, low dynamic range and high inactive time of CCD devices can all be overcome by embodiments of the present invention. However, it will be appreciated that the invention is not limited to high energy and high intensity applications, and that embodiments of the invention can also find application to lower energy applications (e.g., at ultraviolet, optical or infra red wavelengths) and low intensity applications (in astronomy).

Preferably, each pixel circuit comprises a charge storage device for accumulating charge, for example a capacitor and/or a transistor. In a preferred embodiment of the invention charge is accumulated on the gate of a FET, preferably forming one of a pair of FETs connected as a cascade amplification stage.

Preferably also, each pixel circuit comprises circuitry for selectively resetting the charge storage device, for example after readout of any charge stored thereon. A preferred embodiment of the invention comprises a first FET switch responsive to an enable signal to connect the charge storage device to an output line for outputting accumulated charge and a second FET switch responsive to a reset signal to ground the charge storage device to reset the charge storage device.

In some applications, for example gamma cameras and nuclear medicine, the pixel size can be of the order of or less than 1 mm across, preferably approximately 350 $\mu$m across.

In other applications, the pixel cell size can be approximately 150 $\mu$m across or less, preferably approximately 50 $\mu$m across or less and more preferably approximately 10 $\mu$m across with a substrate between 200 $\mu$m and 3 mm thick.

The pixel circuits can be implemented integrally to the substrate and aligned with the corresponding pixel detectors. Alternatively, the pixel circuits can be formed in a further substrate, the further substrate incorporating the pixel circuits being coupled to the substrate incorporating the pixel detectors, with each pixel circuit being aligned with and being coupled to the corresponding pixel detector.

In particular embodiments of the invention, the array comprises a single row of pixel detectors and associated pixel circuits forming a slit-shaped imaging device or a plurality of rows of pixel detectors and associated pixel circuits forming a slot-shaped imaging device. In such an embodiment the pixel circuits for respective pixel detectors can also be arranged laterally adjacent to the corresponding pixel detectors.

An imaging system for the imaging device comprises control electronics for the imaging device including addressing logic for addressing individual pixel circuits for reading accumulated charge from the pixel circuit and selectively resetting the pixel circuit. Preferably, the addressing logic comprises means for connecting output lines of the pixel circuits to an output of the imaging device, means for supplying read enable signals to read enable inputs of the pixel circuits and means for supplying reset signals to reset inputs of the pixel circuits.

The means for connecting output lines can comprise a shift register or a counter for sequentially connecting output lines of the pixel circuits for respective columns of pixels to the output of the imaging device. Likewise, the means for supplying read enable signals can comprise a shift register or a counter for sequentially supplying read enable signals to read enable inputs of the pixel circuits for respective rows of pixels and/or the means for supplying reset signals can comprise a shift register or a counter for sequentially supplying reset signals to reset inputs of the pixel circuits for respective rows of pixels.

Thus, in a preferred embodiment of the invention, the addressing logic comprises a first shift register for sequentially connecting output lines of the pixels circuits for respective columns of pixels to an output of the imaging device, a second shift register for sequentially supplying read enable signals to read enable inputs of pixel circuits for respective rows of pixels and a third shift register for sequentially supplying reset signals to reset inputs of pixel circuits for respective rows of pixels. In another preferred embodiment the same control signals can be implemented with a counter which produces row and column addresses that are decoded to output select, reset and read enable signals. The control electronics can include an analogue to digital converter (ADC) for converting charge read from a pixel circuit into a digital charge value.

At least part of the control electronics can be integrated into the semiconductor substrate on which the pixel circuits are formed.

Preferably the imaging system comprises an image processor connected to the control electronics for processing the digital charge values from respective pixel circuits to form an image for display on a display device.

For optimizing the display of captured images, the processor determines maximum and minimum charge values for pixels for display, assigns extreme grey scale or colour values to the maximum and minimum charge values and allocates grey scale or colour values to an individual pixel according to a sliding scale between the extreme values in dependence upon the charge value for the pixel.

The grey scale or colour values are preferably allocated in accordance with the following formula:

Grey scale value of pixel i=

$$\text{Min}_{grey} + \frac{(i_{charge} - \text{Min}_{charge})}{(\text{Max}_{charge} - \text{Min}_{charge})} \times (\text{Max}_{grey} - \text{Min}_{grey})$$

In a preferred embodiment of the invention, an imaging system comprising a plurality of imaging devices as defined above is tiled together to form a mosaic. This enables a large area imaging device to be constructed without the yield problems normally experienced with very large surface area integrated devices. The mosaic can comprise a plurality of columns of tiled imaging devices, the imaging devices of adjacent columns being offset in the column direction. Preferably, the imaging system includes means for stepping or moving the imaging device and/or an object to be imaged to accumulate an image over a complete image area.

In one embodiment, the imaging system comprises two imaging surfaces, each comprising a mosaic of imaging devices, said imaging surfaces being arranged substantially parallel to one another and spaced from one another with an object to be imaged between said surfaces, the mosaics being offset laterally with respect to one another to give substantially complete imaging of said object. This permits substantially complete imaging in certain applications without the need for translatory mechanisms for the imaging planes.

Respective image outputs of a plurality of tiled imaging devices are preferably connected to a common multiplexer, the output of which multiplexer is connected to a common analogue to digital converter. Alternatively, a plurality of tiled imaging devices can first be daisy-chained and then converted to a common ADC. Also, individual pixel circuits can be addressed for reading accumulated charge at a rate to optimize the resolution of an analogue to digital converter for converting analogue accumulated charge values into digital values. These measures provide design flexibility to optimize between cost (more multiplexing, less ADCs) and image contrast (less multiplexing, more ADCs).

In an imaging system comprising one or more slit- or slot-shaped imaging device(s) as defined above means can be provided for moving the slit- or slot-shaped imaging device(s) in a direction transversely to a longitudinal axis of the imaging device(s) for accumulating a complete image over an imaging area.

In accordance with another aspect of the invention, there is provided a method of operating an imaging system with a slit- or slot-shaped imaging device as defined above, the method comprising moving the slit or slot shaped imaging device(s) in the transverse direction and reading accumulated charge from the pixel circuits of the slit- or slot-shaped imaging device(s) at a rate corresponding to movement of the imaging device(s) by half or less than half of the pixel size in the direction of motion.

In accordance with another aspect of the invention, there is provided a method of operating an imaging system comprising one or more slit- or slot-shaped imaging devices as defined above, the method comprising minimizing the effect of scattered radiation by optimizing the relationship between the following parameters: the distance between a radiation source and an object to be imaged; the distance between the object to be imaged and the slit- or slot-shaped imaging device(s); and the width of the slit- or slot-shaped imaging device(s).

The invention also provides a method for imaging accumulated values corresponding to respective pixel positions within a pixel array such as, for example, charge values accumulated for respective pixel positions of an imaging device as defined above, the method comprising:

determining maximum and minimum accumulated values for pixels within an area of the pixel array to be imaged;

assigning grey scale or colour values at extremes of a grey or colour scale to be imaged to the maximum and minimum accumulated values; and assigning grey scale or colour values to the accumulated values for individual pixels scaled in accordance with the extreme values; and imaging the assigned grey scale or colour values at respective image pixel positions.

In other words, for each portion of an image captured by an imaging device in accordance with the invention, the charge density of all pixels to be displayed is compared, the points of highest and lowest charge density being assigned a colour value at the two extremes of the grey or colour scale being used. The remainder of the pixels points are given a value from the grey or colour scale according to the charge accumulated in the respective pixels.

The invention also provides a method of automatically optimizing imaging using, for example, an imaging system as defined above for different imaging applications where incident radiation leaves a different electrical signal in a pixel detector of a semiconductor substrate dependent on a semiconductor material or compound used and an energy and a type of incident radiation, the method comprising:

determining an expected best resolution using a centre of gravity technique;

determining an expected efficiency as a function of radiation type and energy; and determining a pixel size and thickness as a function of a selected radiation type and energy and a selected semiconductor material or compound.

This method can also include a step of automatically selecting an imaging device having the determined pixel size and thickness.

This method enables automatic optimization of the image processing for different imaging applications where, dependent on the semiconductor material or compound used, incident radiation leaves a different electrical signal related to the energy and type of the incident radiation. In accordance with this method, the expected best resolution is identified using a centre of gravity technique whereby each step of the radiation inside the semiconductor is weighted by the energy loss or equivalently by the charge signal created in the step. Therefore resolution is determined as an average weighted by charge. Similarly, an expected efficiency is determined as a function of radiation type and energy. For each ASID semiconductor material or compound a database provides values for the various radiation types and energies, thus allowing an immediate and automatic optimization of design specifications.

The invention also provides a method for automatically detecting and eliminating detected pixel values representative of radiation incident on a pixel cell of an imaging device, for example an imaging device as defined above, the method comprising:

comparing the detected pixel value to a threshold value related to a minimum detected charge value expected for directly incident radiation; and discarding detected pixel values less than the threshold value.

Thus this aspect of the invention enables incident radiation (in particular low intensity radiation) that has been scattered before entering the imaging device to be eliminated before processing. This is done by discriminating the detected radiation according to the energy deposited in the form of electrical signals. Because scattered radiation has lost some of its energy it will not pass the minimum energy cut-off.

Another aspect of the invention also provides a method for performing real time imaging of an organic or inorganic object, the method comprising:

irradiating the object using a radiation source that produces X-rays, $\gamma$-rays, $\beta$-rays or $\alpha$-rays;

detecting at a semiconductor imaging plane or planes of an imaging device as defined above unabsorbed radiation or radiation that is emitted from selected areas of the object, whereby charge resulting from incident radiation at respective pixel cells of the imaging device is accumulated in respective active circuits of the pixel cells;

addressing the active circuits of the pixel cell individually for reading out accumulated charge;

processing the read out charge to provide image pixel data; and displaying the image pixel data.

Thus, in addition to providing a new imaging device, the invention also provides systems utilizing the imaging device. In a first preferred configuration the imaging pixels are arranging in an M×N matrix where M and N can be several thousands thus providing a full field imaging plane. In another preferred configuration the imaging pixels are arranged in a slit or slot shape with several thousand rows and a few columns per row. The slit or slot is moved at a constant speed over a surface to be imaged and the slit (or slot) frame is read out fast enough so that the distance scanned between adjacent frames is smaller than half the pixel size along the direction of motion. With this configuration and mode of operation it is possible to achieve a point resolution along the direction of motion which is equal to the pixel size in the same direction. Thus, it is possible to improve by a factor of 2 the position resolution obtained with a full field imaging plane or a conventional slit or slot not operating in the mode described. In another preferred arrangement several of the above slits (or slots) are arranged on the same plane parallel to each other and with a constant distance between the longitudinal axis of the slits (or slots). Thus, if there are n such slits (or slots) and the total distance to be scanned is X cm then each slit (or slot) only needs to scan X/n cm. This will reduce the need for high speed scanning mechanics, and the same image can be formed for a unit period of time with the X-ray source operating at a lower current (n times lower current that with a single slit/slot).

The invention also provides a method of operating an imaging device or imaging system as defined above comprising reading the accumulated charge from individual pixel circuits at a rate to optimize the resolution of an analogue to digital converter for converting analogue accumulated charge values into digital values.

The invention also provides methods to utilize the device and system as described.

Thus, the invention provides active accumulative analogue imaging of directly detected high energy rays as opposed to conventional digital imaging techniques based on the counting of hits. According to the invention, a charge (or current or voltage equivalent) value is accumulated rather than a number of points, the charge value being in direct and linear correspondence with the total energy of the initial rays. CCDs can only provide direct imaging at very low energies (near the optical spectrum). For high energy applications (X-rays above 10 keV) CCDs are operated in conjunction with converting screens that convert high energy rays to optical wavelengths to which CCDs are more sensitive. During that process light generation and diffusion substantially worsen the image contrast and resolution. In addition, CCDs are, for all practical purposes, limited to implementation with Si only. It is however known that Si is a relatively low density material with very low efficiency for detecting rays with energy above a few keV.

In accordance with an aspect of the invention, a method is provided for accumulating charge into an image to provide the highest attainable contrast and resolution for a given portion of the image. For every portion of the image this can be done by comparing a charge density of all pixels. The point of highest and lowest charge density can be assigned a colour value of the two extremes of the grey or colour scale that is used. The rest of the points are given a value from the grey or colour scale according to the charge (or current or voltage equivalent) accumulated for those pixels.

The invention also provides a method for minimizing the effect on image resolution of rays that have been scattered before entering the imaging device. Accordingly, when the mode of active, accumulative analogue imaging of directly detected rays is effective, the scattered rays will have a much smaller weight in the contrast scale since they will have deposited much less energy in the imaging device. The deposited energy corresponds to a charge value (or current or voltage equivalent) that, for unscattered rays, is much higher. Thus, when during image processing each pixel is assigned a colour or grey scale value according to the charge value accumulated, the effect of scattered radiation can be minimized.

The invention also provides a method for excluding rays that have been scattered, either coherently or incoherently, before entering the imaging device. A slot technique is used to this effect with a collimated ray source which is adjusted to emit rays which are aimed at an imaging slot. By optimizing the distance separating the ray source from the object under observation, the distance separating the object under observation from the imaging slot and the width of the slot a geometry can be determined which minimizes the detection of scattered rays. This is a result of scattered rays "seeing" a small phase space and having "no reason" to enter the thin imaging slot. This method is particularly powerful as it is a geometric technique and does not require knowledge of the energy of the rays. Scattered rays, whether they have been scattered incoherently and have lost some of their energy (Compton scattering) or coherently and have preserved all their energy (Rayleigh scattering) will most likely not be detected.

The invention also provides for excluding from detection radiation which has been scattered before entering the imaging device in low intensity applications. Through the use of a threshold to eliminate detected radiation with an energy below a predetermined value, energy which has been scattered incoherently and has lost some of its initial energy can be eliminated from detection.

The invention also enables the automatic optimization of a particular configuration for each imaging application. A different electrical signal will be deposited in dependence upon the semiconductor material used and the type and energy of the radiation. An expected best resolution can be found using a centre of gravity method. An expected efficiency as a function of radiation type and energy can also be determined. For every semiconductor pixel material or compound a data base can provide values for various radiation types and energies, thus allowing an immediate and automatic optimization of the design specification.

An imaging device or an imaging system as defined above can be used for conventional X-rays, for chest X-rays, for X-ray mammography, for X-ray tomography, for computerized tomography, for X-ray bone densiometry, for γ-ray nuclear radiography, for gamma cameras for single photon emission computerized tomography (SPECT), for positron emission tomography (PET), for X-ray dental imaging, for X-ray panoramic dental imaging, for β-ray imaging using isotopes for DNA, RNA and protein sequencing, hybridization in situ, hybridization of DNA, RNA and protein isolated or integrated and generally for β-ray imaging and autoradiography using chromatography and polymerars chain reaction, for X-ray and γ-ray imaging in product quality control, for non-destructive testing and monitoring in real-time and online, and for security control systems and real-time imaging using radiation, including light.

BRIEF DESCRIPTION OF THE DRAWINGS

Exemplary embodiments of the invention are described hereinafter by way of example only with reference to the accompanying drawings in which:

FIGS. 7A–7D illustrate an example in which two imaging planes are located on opposite sides of an object to be imaged in accordance with one application of the invention;

DESCRIPTION OF THE PREFERRED EMBODIMENTS

Figure 1:
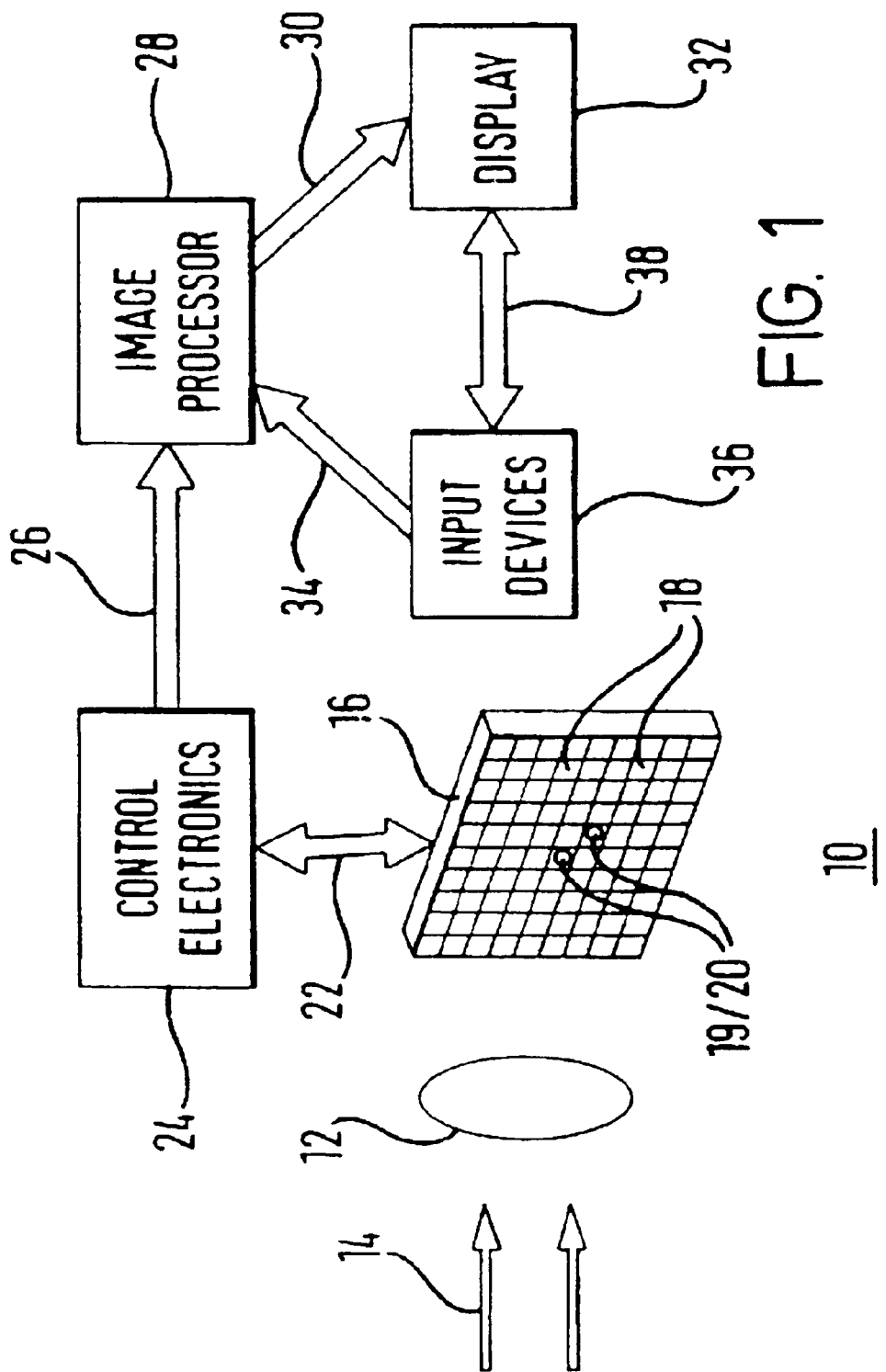
FIG. 1 is a schematic block diagram of an imaging system including an embodiment of an imaging device in accordance with the invention.

FIG. 1 is a schematic representation of an example of an application for an imaging system 10 including an embodiment of an imaging device in accordance with the invention.

This application relates to radiation imaging of an object 12 subjected to radiation 14. The radiation may, for example, be X-ray radiation and the object 12 may, for example be a part of a human body.

The imaging device comprises an Active-pixel Semiconductor Imaging Device (ASID) 16 comprising a plurality of pixel cells 18. The imaging device detects directly high energy incident radiation such as X-rays, γ-rays, β-rays or α-rays and accumulates at each pixel cell, by means of a randomly accessible, active, dynamic pixel circuit on or adjacent to a corresponding pixel cell detector, values representative of the radiation incident at that pixel cell.

The ASID can be configured as a single semiconductor substrate (e.g., silicon) with each pixel cell comprising a pixel detector 19 and an active pixel circuit 20. Alternatively, the ASID can be configured on two substrates, one with an array of pixel detectors 19 and one with an array of active pixel circuits 20, the substrates being mechanically connected to each other by, for example, conventional bump-bonding technology.

Each pixel cell 18 is in effect defined on the substrate by electrodes (not shown) which apply a biasing voltage to define a detection zone (i.e., the pixel detector 19) for the pixel cell 18. Active pixel circuits 20 in the form of electronic structures (e.g., of transistors, capacitors. etc.) can be defined on each pixel cell 18 or at a corresponding location on the associated second substrate to accumulate charge created in the pixel detector when, for example, a photon or a charged particle of radiation is incident on the depletion zone of the pixel cell 18. An active pixel circuit 20 and the pixel detector 19 can be of the order of a few tens of microns in size (e.g., 10–50 μm). Examples of active pixel circuits are described hereinafter with reference to FIGS. 2, 8 and 11.

As mentioned above the active pixel circuits 20 can be constructed integrally to the semiconductor substrate 16 on the pixel cells 18 as part of the semiconductor processing. Special processing techniques can be employed for integrating the pixel circuits on the same wafer with the detecting pixels. Alternatively, the active pixel circuits 20 can be constructed on a second wafer and distributed to correspond to the pixel detectors 19 defined for respective pixel cells 18 on a first wafer. The two elements can then be connected together in a known manner using, for example, bump bonding so that the active pixel circuit 20 for each pixel cell 18 is located adjacent to (behind) and overlies the corresponding pixel detector 19 for that pixel cell 18.

The pixel detectors 19 are formed with a depletion zone such that, when a photon is photo-absorbed in the semiconductor substrate 16 at a pixel cell 18 creating an electric charge or when a charged radiation ionizes the depletion zone of the semiconductor substrate 16 at a pixel cell 18, an electric pulse flows from the semiconductor substrate depletion zone to the active pixel circuit 20 for that pixel cell 18. A value associated with the electric pulse is then accumulated in an active circuit element, either directly as a charge value or as an equivalent voltage or current value such that new charge created from subsequent incoming radiation is added continuously. Examples of possible accumulating devices are an integrated capacitor or the gate of an integrated transistor. The charge accumulation process in an active pixel circuit 20 continues until control signals are issued from control electronics 24 to start a process of reading out information by addressing each pixel cell, effectively in a random access manner, from each individual pixel cell. During readout of the accumulated charge values, charge continues to be accumulated because the readout is always done individually for detecting pixel cells. Pixel circuits may selectively be reset after readout to discharge the charge accumulation circuit elements, and only then are pixels inactive for a very short time (practically no dead time as will be shown). Thus, only during resetting are individual pixels inactive.

Figure 1A:
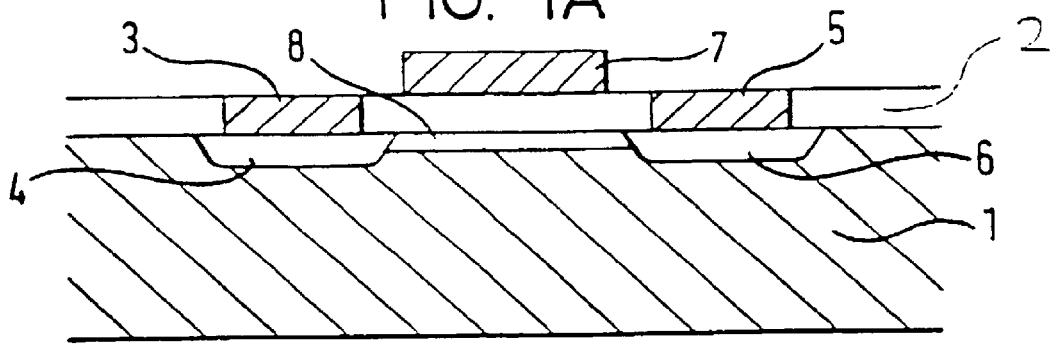
FIG. 1a is a schematic representation of a FET.

FIG. 1a shows the charge accumulation principle of one example of a pixel circuit charge accumulation element in accordance with the present invention. In this example a field effect transistor is formed on a semiconductor substrate. Specifically, n+ doped regions 4 and 6 are formed for the source and drain, respectively, in a P-type silicon substrate 1. Electrodes for the source 3 and drain 5 are formed in an oxide layer 2, a gate electrode 7 being formed over the oxide layer 2. Charge is accumulated on the gate electrode 7 of a field effect transistor (MOSFET) by virtue of the FET gate capacitance. As charge accumulates on the FET gate it decreases the electron concentration in the FET inversion layer 8 (the layer with minority-electron carriers needed for the FET operation). The maximum charge that can be accumulated depends on the minimum allowable electron density in the inversion layer. The charge accumulation is therefore not affected by any dark current coming from the bulk silicon as in the case of a CCD, because charge is not accumulated in any depleted volume. Charge accumulation capacity is determined only by the total FET gate area (which can be substantially close to the pixel circuit area), the oxide layer thickness (which can be as thin as few nm or tens of nm) and the FET dynamic range (which determines the maximum gate voltage). It should be noted that this is just an example of a pixel circuit charge accumulation element, and according to the invention charge can be accumulated in any suitable charge accumulating device implemented in the corresponding pixel circuit.

The pixel pitch can be as small as 10 μm which results in excellent position resolution and consequently excellent image resolution.

Figure 2:
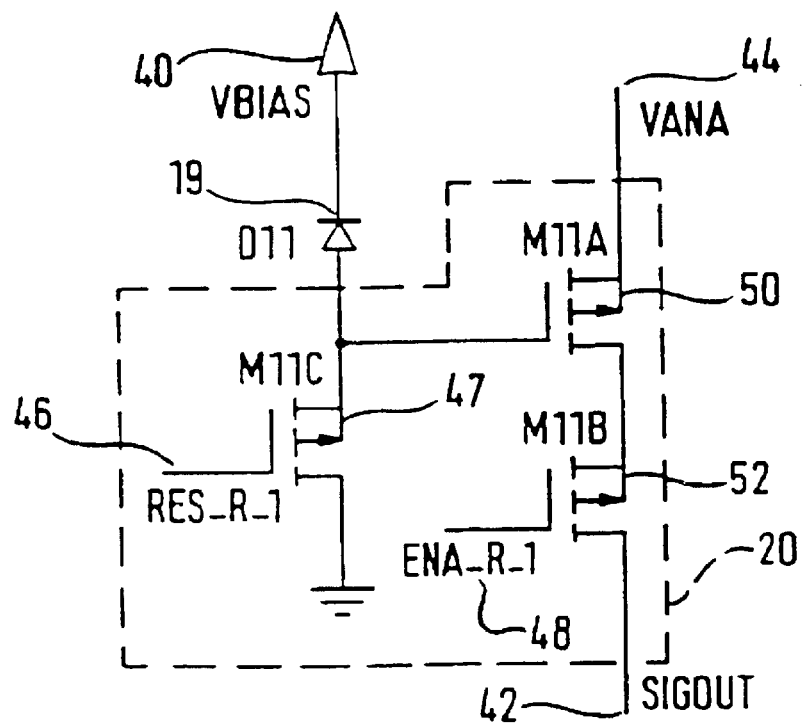
FIG. 2 is a schematic circuit diagram of one example of a pixel circuit for an imaging device in accordance with the invention.

FIG. 2 illustrates one preferred example of an active pixel circuit 20 for a pixel cell in an example of an imaging device in accordance with the invention. This example of the invention uses field effect transistors (FETs) arranged as a cascade connected amplifier. VBIAS 40 is a bias voltage input across the depletion zone forming the pixel detector 19 of the pixel cell. The pixel detector 19 is represented by the diode symbol D11. In the pixel circuit itself, SIGOUT 42 is an analogue signal output and VANA 44 an analogue power supply input. RES-R-1 is a reset input and ENA-R-1 is an enable input for the pixel circuit. Charge is accumulated in the gate of a transistor M11A 50 when both the RES-R-1 46 and ENA-R-1 48 inputs are low.

The gate capacitance substantially forms the input node capacitance (total capacitance) thus maximizing charge storage ability. It is an aim of the current invention to provide maximum charge accumulation ability by minimizing the parasitic or unwanted capacitance of all other circuit (and detector) components and forming substantially all input node capacitance from the charge accumulation transistor M11A 50. For a 35 μm by 35 μm pixel circuit the M11A 50 capacitance can be 2 pF and the FET gate voltage dynamic range can be at least 2 Volts. This corresponds to about 25,000,000 electrons in storage capacity which is more than 100 times the capacity of a CCD of the same pixel size. It should be noted that the 2 pF of the FET capacitance in the above example substantially forms all of the input node capacitance of the pixel cell. In the above example of 35 by 35 μm pixels the total parasitic capacitance of the detector and the other elements in each pixel circuit and corresponding pixel detector is in the range of a few fF or tens of fF. The capacitance of the charge storage device should be maximized and in any case be substantially bigger than the parasitic capacitance in each pixel cell. In the example above the capacitance of the FET acting as a charge accumulating device in the pixel circuit is more than 90% of the total capacitance of the pixel cell comprising a pixel detector and the corresponding pixel circuit. As a result of this, substantially all collected charge will be accumulated in the charge accumulating FET rather than being shared among the detectors, and the rest of the pixel circuit elements.

It will be appreciated that the use of a FET provides an example, only of the invention, in which example charge accumulating capacitance is maximized using a pixel charge storage device (such as a FET gate or a capacitor) that accounts for most of the input node capacitance for each pixel.

To read the pixel cell, ENA-R-1 is taken to a high state, which allows current to flow from the transistor M11A 50 through the transistor M11B 52 to SIGOUT 42. The pixel circuit is reset by taking RES-R-1 to high, whereupon after RES-R-1 has been at high for merely a few microseconds, any accumulated charge will have been removed from the gate of the transistor M11A 50. Immediately after RES-R-1 46 goes to a low level, charge can begin to accumulate at the gate of the transistor M11A 50. If no reset pulse is supplied to the reset input RES-R-1 46, then it is to be noted that a reading operation when the enable input ENA-R-1 goes high does not destroy the charge but instead merely causes a current flow directly proportional to the accumulated charge. This allows multiple readings without resetting.

Figure 11:
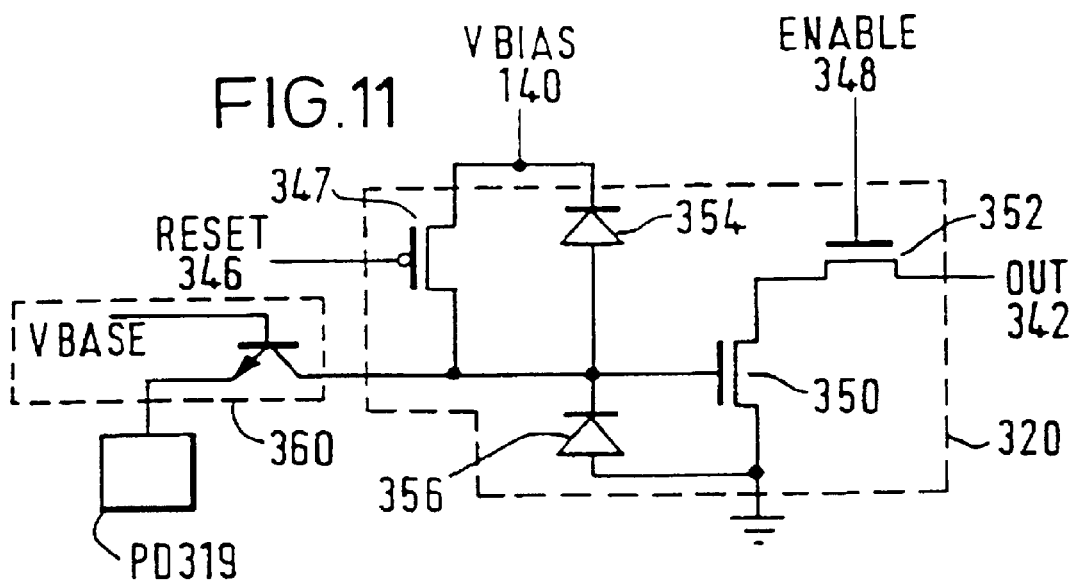
FIG. 11 is a schematic circuit diagram of another example of a pixel circuit for an imaging device in accordance with the invention.

FIG. 11 illustrates a further example of an active pixel circuit 320 for a pixel cell in an example of an imaging device in accordance with the invention. This example is similar to the example of FIG. 2. The pixel detector is represented at PD 319 of the pixel cell. In the pixel circuit itself, VBIAS 140 is a voltage bias, OUT 342 is an analogue signal output. RESET 346 is a reset input connected to a reset FET 347 and ENABLE 348 is an enable input connected to an enable FET 352 for the pixel circuit. Charge (electrons) is (are) accumulated in the gate of a charge storage FET 350 when the ENABLE 348 input is low and the RESET 346 input is high. To read the pixel cell, ENABLE 348 is taken to a high state, which allows current to flow from the FET 350 through the FET 352 to OUT 342. The pixel circuit is reset by taking RESET to low, whereupon after RESET 346 has been at low for merely a few microseconds, any accumulated charge will have been removed from the gate of the FET 350. Immediately after RESET 346 goes to a high level, charge can begin to accumulate at the gate of the FET 350. If no reset pulse is supplied to the reset input RESET 346, then it is to be noted that a reading operation when the enable input ENABLE goes high does not destroy the charge but instead merely causes a current flow directly proportional to the accumulated charge. It will therefore be seen that the operation of the circuit of FIG. 11 is similar to that of FIG. 2. In addition, the circuit of FIG. 11 includes diodes 354 and 356 which act as overload protection circuitry for the pixel circuit. The diodes provide protection both against static electricity which might damage the FETs and against FET overload. If the FET gate 350 accumulates more than a predetermined charge threshold (e.g., corresponding to 5 volts, which is the voltage bias) then current will start to flow through the diode 356 towards the ground thus protecting the FET 350. This will protect pixel cells which, for example, receive a full radiation dose outside the perimeter of an object to be imaged. Preferably the two FETs 350 and 352 are implemented as a cascade amplifier stage. In this configuration the two FETs 350 and 352 provide impedance-up conversion without increasing the noise accordingly. Consequently, the noise level from each pixel circuit described in the current embodiment is only about 500 e while the pixel circuit retains very small size (as small as 10–20 μm pixel size), very large dynamic range of about 50,000,000 e and individual addressability.

FIG. 11 also illustrates an optional bipolar transistor 360, which may be omitted. The purpose of the bipolar transistor, with its connection to a voltage source VBASE, will be described later.

Figure 10:
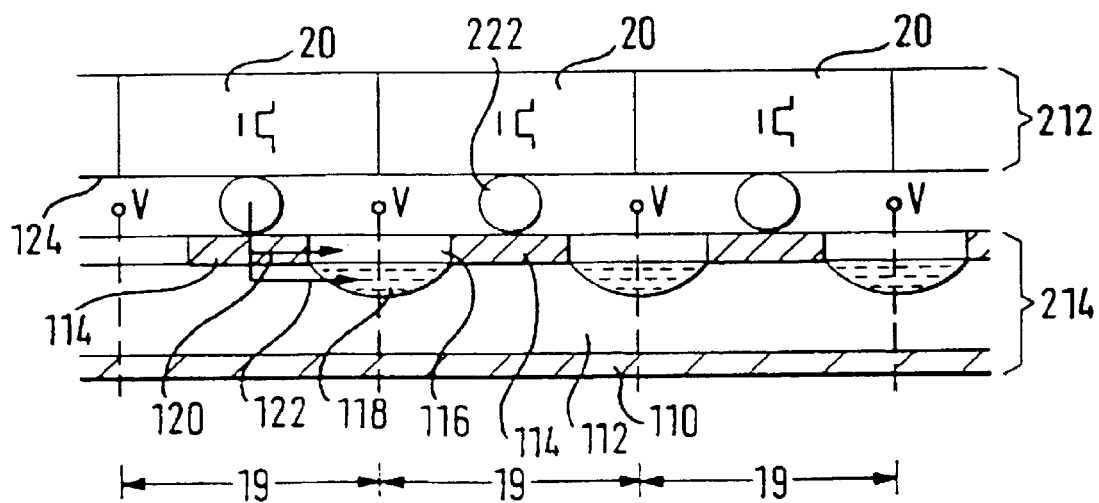
FIG. 10 is a cross-section view of part of an example of an imaging device in accordance with the invention.

FIG. 10 is a schematic illustration of one embodiment of an imaging device in accordance with the invention. The imaging device illustrated in FIG. 10 comprises a pixel detector substrate 214 with the active pixel circuits formed on a second substrate 212 which is connected to the pixel detector 214 by means of microbumps 222. The active pixel circuits 20 are schematically represented within the substrate 212 by means of the symbol of a FET.

The pixel detector substrate 214 is provided with a continuous electrode 110 on the site of the substrate which is exposed to incident radiation. In other words, in FIG. 10, the incident radiation is assumed to arrive in an upwards direction. The body of the pixel detector substrate 112 thus lies behind the continuous electrode 110. On the rear surface of the layer 112, a plurality of pixel detector electrodes 114 are provided. It is the array of pixel detector electrodes 114 which effectively defines the individual pixel detector cells 19 within the pixel detector substrate 214. Each of the pixel detector electrodes 114 is electrically and mechanically coupled to a respective pixel circuit 20 by a respective microbump 222. It will be appreciated that the representation in FIG. 10 is highly schematic, and not to scale.

In addition to the features already described above, FIG. 10 also illustrates optional features which can be used for isolating individual pixel circuits in a manner to be described below.

For different detector pixel cells the corresponding charge storing FETs 350 may accumulate different amounts of charge as a result of the different radiation or light intensities incident upon the detector pixels. Consequently a potential difference is created between adjacent pixels. If the pixels are not electrically separated this potential drop may cause signal charge to leak from one pixel circuit through the detector and into the neighbouring pixel circuit. The longer the accumulation time, the more severe the problem could be. In accordance with a preferred aspect of the invention, this effect is diminished or eliminated by providing means for electrically separating, or equivalently maximizing the resistance of adjacent pixel cells. Accordingly, a passivation layer 116, for example of polyamide, is applied between detector pixel cells (i.e. between the electrodes 114 that define the detector pixel cell). This electrically separates adjacent detector pixel cells since such a passivation is non conductive. Additionally, electrodes may be applied on the passivation layer and an applied voltage V will create a barrier potential 118 penetrating several micrometers inside the detector volume. Thus charge attempting to escape from the charge accumulating FET in a pixel circuit 20 will encounter the barrier potential and will not be dissipated into the adjacent pixel circuit FET.

Furthermore a third option is to provide an npn transistor (bipolar transistor) at the entrance of each pixel circuit. This is shown in FIG. 11. When the base of the bipolar transistor is set at an appropriate voltage common to all bipolar transistors of the pixel circuits (about 1V) the bipolar transistor will act as a diode allowing charge to flow into the gate of the FET 350 but at the same time prohibiting any escape along the reverse path. In this way, while maintaining different potential drops at the gates of the charge accumulating FETs 350 (proportional to the different signal charges that have been accumulated), the potential at the entry of the pixel circuits is common to all pixel circuits. Thus, in accordance with this aspect of the current invention, means are provided to electrically separate pixel cells in the imaging device so as to retain all or substantially all charge accumulated on each pixel circuit. This preferred aspect of the invention is particularly useful when accumulation times are rather long, for example in the range of tens or hundreds of microseconds and even more useful when accumulation times are in the range of msec or tens or hundreds of msec.

A pixel circuit 20 can accumulate an electric charge representative of up to 60,000,000 electrons on each pixel while maintaining a pixel size less than 50 $\mu$m by 50 $\mu$m. The pixel thickness or portion of the pixel detector that is fully depleted can be up to 3 mm, thus making these detectors very sensitive to X-rays with energies less than 200 keV. For charged radiation the sensitivity is practically 100%. The minimum pixel thickness can be of the order of 200 $\mu$m which can give improved resolution when lower energy charged radiation is to be detected. The dead layer of the semiconductor substrate which is insensitive to radiation can be as thin as 50 nm so that a signal from β-radiation with energies less than 30 keV is not lost.

Figure 3:
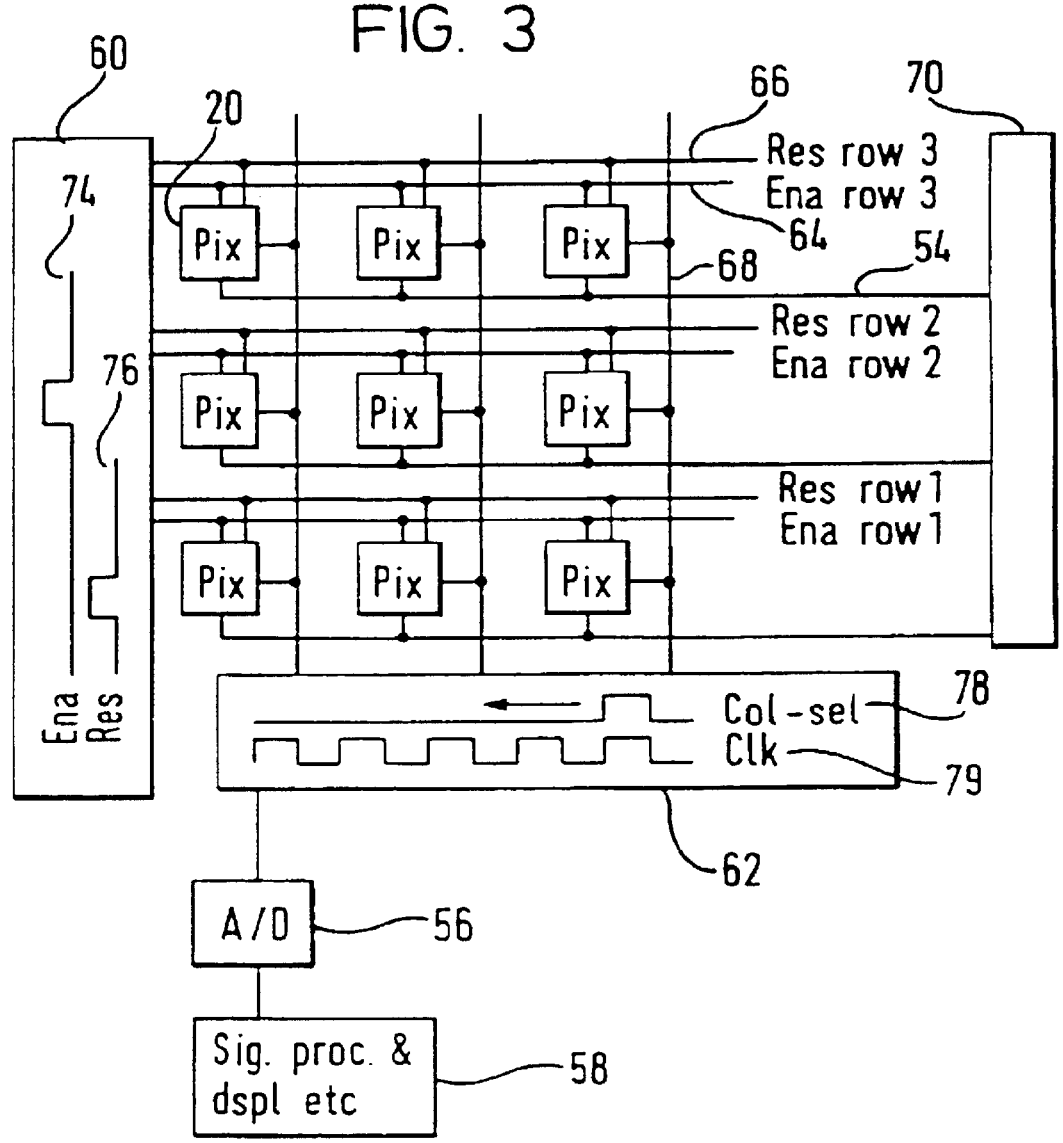
FIG. 3 is a schematic diagram of part of an imaging array and control electronics for an imaging device in accordance with the invention.

FIG. 3 is a schematic representation of one possible configuration of the control electronics 24 of FIG. 1 and the relationship of the control electronics 24 to an m×n matrix of the active circuits 20 of the pixel cells 18. For ease of illustration an array of 9 pixel cells is illustrated in FIG. 3 and only some of the signal lines which make up the path 22 in FIG. 1 are shown. It will be appreciated that an imaging device in accordance with the invention will normally include a significantly larger number of pixel cells than are shown in FIG. 3. The row select logic 60 controls the row readout (ENA 74) and the row reset (RES 76) and the column logic 62 enables (COL-SEL) the readout of accumulated charge values from each pixel circuit 20 in response to a clock signal 79.

The control electronics 24 include row select logic circuits 60, column address logic circuits 62, power supply circuits 70, Analogue to Digital Converter (ADC) 56 and the signal processing circuits 58. Preferably some, if not all, of the control electronics 24 is implemented on the substrate 16 at the periphery of the image array formed by the array of pixel cells 18.

The power supply circuits 70 provide power for the individual active circuits 20 on the pixel cells 18 via lines 54 (shown schematically in FIG. 3) and can additionally be arranged to supply the biasing voltage via lines (not shown) for the electrodes defining the pixel cells.

The row select logic 60 provides signals via row enable and reset lines 64 and 66, respectively (also shown schematically in FIG. 3), for selecting columns for the reading and resetting, respectively of the individual active circuits 20 of the pixel cells 18. The row select 64 and row reset 66 lines are connected to the enable input ENA-R-1 48 and the reset input RES-R-1 46, respectively of each of the pixel circuits of the row. Also shown in the row select logic 60 are row enable 74 and row reset 76 signals for scanning successive rows. It can be seen that the reset pulse 76 follows the row enable pulse 74 to cause resetting of the active circuits after reading.

The column select logic 62 effectively comprises a multiplexer for selecting signals output via the column lines 68 (also shown schematically in FIG. 3), each column line being connected to the SIGOUT output 42 of each pixel circuit 20 in that column. The COL-SEL signal 78 represented in the column select logic 62 thus selects columns for reading the individual active circuits 20 of the pixel cells 18 currently selected by the row enable pulses 74. In the embodiment shown the column select pulse is clocked for successive column positions in response to the clock CLK 79 during one row enable period, so that the accumulated charge value of a respective active pixel circuit on the row currently selected is clocked out at each clock pulse before the row select pulse proceeds to the next row. Each active pixel circuit of the row just read is then reset simultaneously by the row reset pulse 76.

The connections shown in FIG. 3 are readily realizable using conventional double metallization technology. Although, as described with reference to FIG. 3, the pixels are read out sequentially in a predetermined order, it will be appreciated that the pixels are in effect accessed in a random access manner by means of separate row and column enable signals. It will be appreciated also that the scanning direction could be reversed (rows to columns) or indeed individual pixels could be accessed in a totally random order by suitable row and column enable signals. It will also be appreciated that the degree of sequential or parallel processing can easily be modified to match the needs of each application. For example all rows can be set simultaneously at an enable high state so that the column select clock will output in parallel all rows, thereby increasing the readout rate. The resetting of rows need not match the readout rate. After multiple readings each row may be reset at a lower rate than the readout rate. It will be appreciated that the designation of rows and columns is arbitrary and can be reversed.

Figure 4:
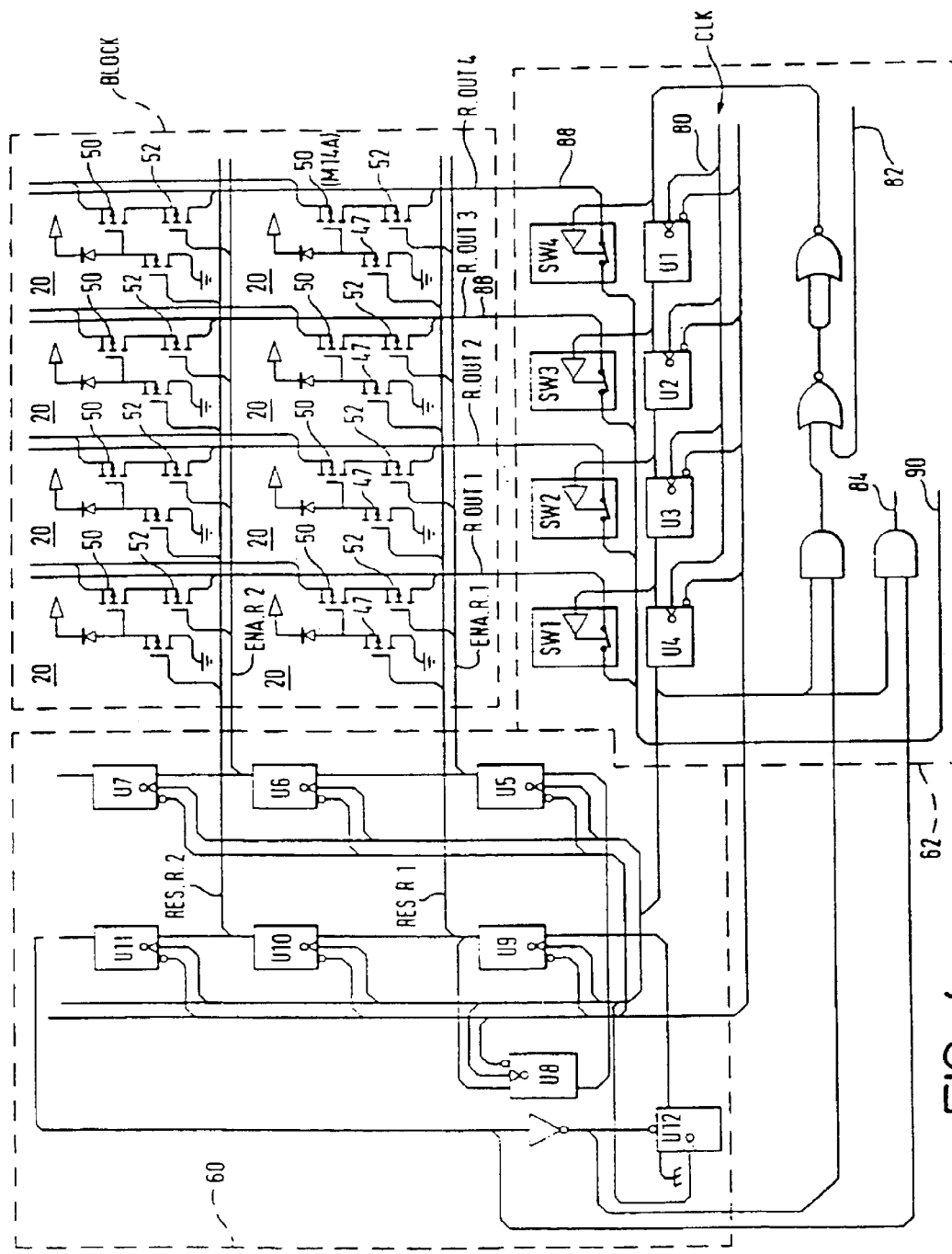
FIG. 4 is a schematic circuit diagram of part of an imaging array and control electronics for an imaging device with blocks of pixel cells of an imaging device in accordance with the invention.

To cover a very large imaging surface in an effective way, the pixel cells are preferably grouped in blocks of m×n pixels with the pixels within a block being read out and reset sequentially in rows. FIG. 4 is a schematic diagram showing a block of two rows by four columns of pixel circuits 20. The pixel circuits accumulate charge on the gates of the transistors MijA, where i=1,2 and j=1,2,3,4. In order to keep the transistors at a low potential, each gate is grounded after reading. Readout is initiated by applying a clock-pulse train to the CLK input 80, and a one clock period high (read bit) to an RB-IN input 82.

During the first clock period the RB-IN input 82 enables the switch SW4, which connects the analogue output line 68 for the fourth column to the analogue output ROUT 88. Thus, when the row enable input ENA-R-1 for the first row is high, which opens the switch transistors M1*B 52 of the first row, during this first clock period, a signal current representative of any charge stored on the gate of the transistor M14A 50 of the pixel circuit 20(1,4) flows through that transistor and via the switch SW4 to the analogue output ROUT 90.

By the next clock period of the clock CLK, the RB-IN input must be down. The high state, originally at the input of a flip-flop U1 is clocked by the clock train CLK to the input of a flip-flop U2 and switch SW3 which then connects the analogue output line 68 for the third column to the analogue output ROUT 88 so that a signal current representative of any charge stored on the gate of the transistor M13A 50 of the pixel circuit 20(1,3) can flow through that transistor and via the switch SW3 to the analogue output ROUT 90. Because the SW4 is now low (down) the analogue output line 68 for the fourth column is disconnected. The read bit thus ripples through the switches SW4-SW1 and flip-flops U1-U4 for successive clock pulses of the clock CLK. The column enable flip flops U1-U4 form a first shift register.

When the read bit is clocked out of the flip-flop U4 it is clocked back to the flip-flop U1. It is also clocked to the clock inputs of row-enable logic U5-U7 and row reset logic U9-U11. Each time these receive a clock input from the output of flip-flop U4 they advance a read bit and a reset bit, respectively, the reset bit moving one step behind the read bit. The row enable logic flip flops U5-U7 form a second shift register and the row reset flip flops U9-U11 a third shift register.

In this way, each time a row is read out, the read bit is moved up one row. Similarly the reset bit is moved up one row, but one row behind the read bit. When the reset bit is read out of the last flip-flop U11, it is supplied to the read bit out RBO output 84 and a new read cycle can be initiated. The time between successive read operations should be sufficiently short to keep the gates of the transistors MijA with relatively small potential differences, preferably potential differences below 2V from the reset potential (or potential of zero charge accumulation).

In another preferred embodiment of the invention, the same functions shown in FIG. 4 can be implemented with a counter that produces row and column addresses which can be decoded to the same control signals as in FIG. 3, COL-SEL 78, RES 76 and ENA 74.

The storage capacity of the transistors MijA depends upon the capacitance and the voltage on the gate of the transistor. The transistors MijA can withstand up to 10V, but it is desirable to keep the gate voltage well below this at up to about 2V potential difference from the reset potential. The gate capacitance can be up to about 5 pF for pixel sizes below 50 $\mu$m by 50 $\mu$m. This means that 6×10$^7$ electrons can be stored. This is about 86 times the capacity of a CCD which stores charge within the storage well within the substrate.

To appreciate the advantages offered by an imaging device according to the invention, consider a single imaging device of dimensions 2 cm by 2 cm. If the pixel size is 35 $\mu$m by 35 $\mu$m then the imaging plane comprises 571 rows by 571 columns of pixels. Accordingly if the imaging device is an ASID then the total of 326,041 pixels can be read out every 32 msec with a multiplexer clock rate of 10 MHz. Thus, in this example with just one readout channel, one frame will be displayed every 32 msec offering real time imaging. Since the pixel circuits have a charge storage capacity of tens of millions of electrons, an ASID can indeed cope with the highest foreseeable intensity applications. This is done at the expense of neither image spatial resolution (pixel size in this example is 35 $\mu$m) nor dead and inactive imaging time. Indeed each row of pixels can be reset immediately after readout for as long as the readout of the next row lasts (readout cycle was explained in a previous paragraph). This row readout time is 100 nsec times the number of pixels per row, i.e. 57.1 micro seconds. Then, over a 32 mseconds image frame acquisition time, the inactive time is just 57 microseconds or 0.17%, which is practically no dead time. Therefore an ASID achieves high spatial resolution, real time imaging with 32 msec image frame updates, very high dynamic range, practically no dead time, very low electronic noise and is despite all that in a cost effective manner by requiring only one readout channel in this particular example. Also by directly accessing every pixel circuit, it is trivial in an ASID to store a calibration image frame with individual pixel pedestals stored and subtracted from every accumulated image frame. This calibration run can be done in a real time imaging application every few seconds or more rarely since the pedestals and very low noise level in an ASID remain stable.

Figure 8:
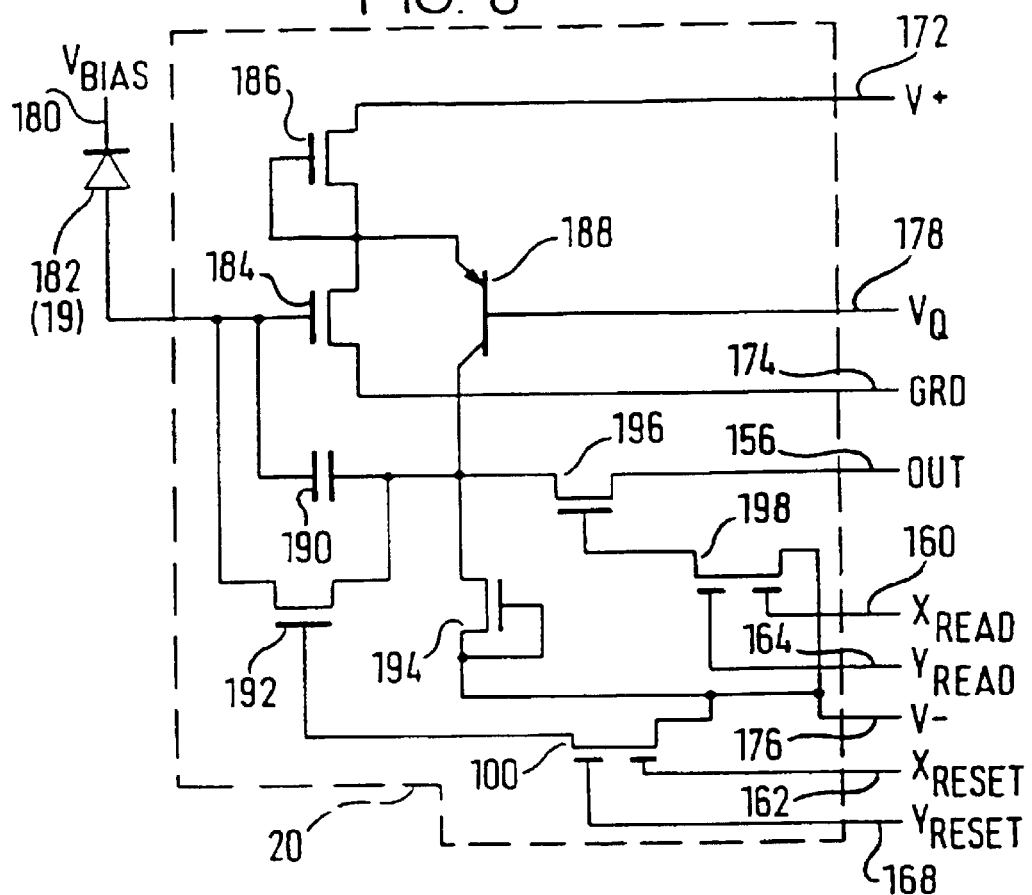
FIG. 8 is a schematic circuit diagram of another example of a pixel circuit for an imaging device in accordance with the invention.

FIG. 8 is a circuit diagram of a further example of an active circuit 20 for a pixel cell 18 in accordance with an embodiment of the invention.

The pixel detector 19 is represented by the diode symbol 182 (the detector may alternatively act as a resistor) connected to the voltage bias Vbias 180, this being applied via the electrode (not shown) defining the depletion volume or pixel detector 19 of the pixel cell 18.

Charge created by radiation incident on the depletion volume 19 of the pixel cell 18 is input to the base of a first, input transistor 184 (here a field effect transistor (FET) having a transconductance of, for example, 0.3 mS and a drain source current value $I_{DS}$ of 100 $\mu$A and a capacitance of 0.1 pF). The source and drain of the input FET 184, are connected between a first current source 186 (here a suitably configured FET, although this could be replaced by a resistor) and a ground line GND 174. The current source 186 is in turn connected to a positive supply line V+ 172.

The junction between the input FET 184 and the current source 186 is connected to one terminal of a second transistor 188 forming a common base bipolar amplifier controlled by the bias voltage applied to its base. The base of the second transistor 188 is connected to the bias voltage line $V_Q$ 178. The remaining terminal of the second transistor is connected via a feedback capacitor Cf 190 (e.g., with a capacitance of 0.3 pF) to the base of the input FET 184.

The junction between the second transistor 188 and the capacitor Cf 190 is also connected to a second current source (here a suitably configured FET, although this could be replaced by a resistor) to a negative supply line V− 176. Charge resulting from radiation incident on the depletion volume of the pixel cell can thus be accumulated at the capacitor Cf 190.

X and Y read lines, Xread 160 and Yread 164, are connected to read logic 198 (here a dual base FET) which in turn is connected between the negative supply line V− 176 and an output switch 196 (here a FET) whereby charge collected on the capacitor Cf 190 can be output via an output line 156 when a signal is supplied on the Xread and Yread lines 160 and 164 simultaneously. The X and Y reset lines, Xreset 162 and Yreset 168, are connected to discharge logic 100 (here a dual base FET) which in turn is connected between the negative supply line V– 176 and a discharge switch 192 (here a FET 192) for discharging and thereby resetting the capacitor Cf 190 when a signal is supplied on the Xreset and Yreset lines 162 and 168 simultaneously.

The circuit shown in FIG. 8 forms a charge sensitive amplifier with charge storage capability in the feedback capacitor Cf 190 and with output and resetting circuitry. Depending on the charge storage time and radiation hardness requirements, the FETs can be implemented by an appropriate technology such as JFET or MOSFET. If the capacitor Cf 190 has a capacitance of 0.3 pF, this corresponds to a storage capacity of about 1.8 million electrons. If the capacitor Cf 190 has a capacitance of 1 pF, this corresponds to a storage capacity of about 6 million electrons. The maximum output clock frequency with a reset FET in the output line is 5–10 MHz. This maximum output frequency reduces to about 200 kHz without a reset FET in the output line.

The circuitry illustrated in FIG. 8 could be implemented on, for example, a pixel cell having a size of approximately 150×150 μm. In applications such as gamma cameras and angiography the pixel size does not need to be smaller than about 150 μm across. In this case the additional space on the pixel circuits allows for other operations besides charge accumulation, read out and reset. For example, the FIG. 8 arrangement amplifies the charge value that has been accumulated. Additionally, the FIG. 8 arrangement could be modified to provide charge discrimination of incoming radiation hits prior to accumulation on the pixel circuit. In this way incoming radiation corresponding to lower than expected energy can be excluded before being accumulated on the pixel circuit. Around the outside of the imaging area formed by the array of imaging cells some or all of the control electronics 24 may also be implemented as an integral part of the semiconductor substrate wafer 16.

Figure 9A:
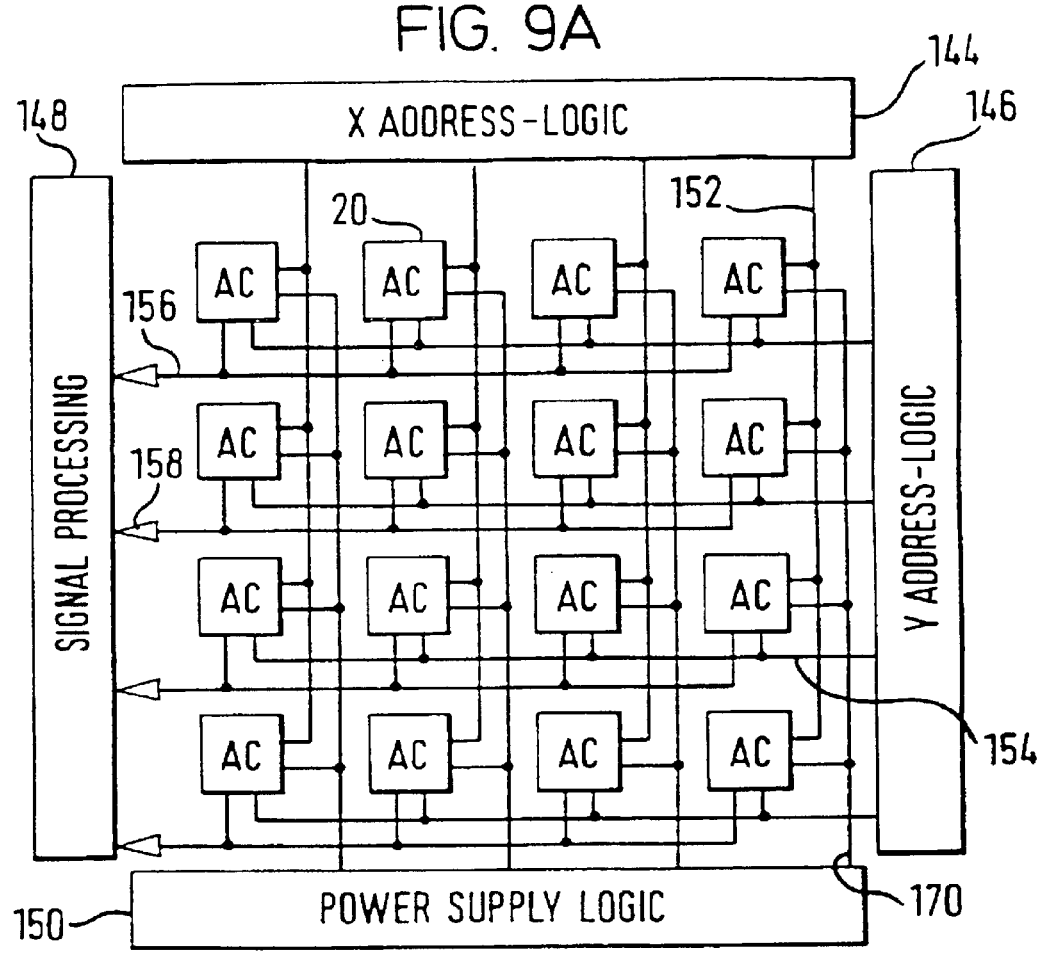
FIGS. 9A and 9B are schematic block diagrams of parts of an imaging array and control connections, respectively, for the embodiment of FIG. 8.

FIG. 9A is a schematic representation of the control electronics 24 in more detail and the relationship of the control electronics 24 to active pixel circuits 20 of the type illustrated in FIG. 8 on the substrate 16. For ease of illustration an array of 16 pixel cells is illustrated in FIG. 9A and only some of the signal lines which make up the path 22 in FIG. 1 are shown. It will be appreciated that an imaging device in accordance with the invention will normally include a significantly larger number of pixel cells 18 than are shown in FIG. 9A.

The control electronics 24 include X address logic circuits 144, Y address logic circuits 146, power supply circuits 150 and signal processing circuits 148. Preferably some, if not all, of the control electronics 24 is implemented on the substrate on which the pixel circuits are implemented at the periphery of the array of pixel circuits. The power supply circuits 150 provide power for the individual pixel circuits 20 via lines 170 (shown schematically on FIG. 9A) and can additionally be arranged to supply the biasing voltage via lines (not shown) for the electrodes defining the pixel cell detectors. The X and Y addressing logic 144 and 146 provide signals via row and column lines 152 and 154, respectively, (shown schematically in FIG. 9) for controlling the reading and resetting of the individual pixel circuits 20. The signal processing circuitry 148 is connected to output lines 156 shown schematically in FIG. 9A for the active circuits 20. In the embodiment of FIG. 9A, one output line is provided for each row of pixel circuits 20 and is connected via an output amplifier 158 to the signal processing circuitry 148. However, it will be appreciated that as alternatives separate output lines could be provided for each column, or for groups of rows or columns or for groups of pixel cells/circuits as desired.

Figure 9B:
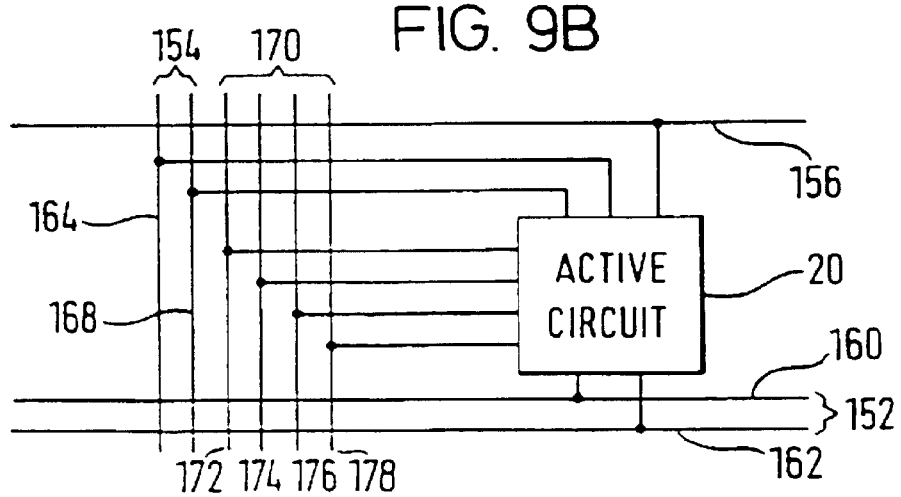

FIG. 9B illustrates in more detail the signal lines which are provided between the control circuitry 24 and a pixel circuit 20 for a pixel cell 18 in accordance with this embodiment of the invention. The power supply lines 170 comprises a positive supply line V+ 72, a ground line GRD 174, a negative supply line V– 176 and an amplification power line Vq 178. The row lines 152 comprise an Xread line 160 and an Xreset line 162 and the column lines 154 comprise a Yread line 164 and an Yreset line 168. One output line is provided for each row in this embodiment as has already been explained.

The pixel circuits shown in FIGS. 2, 8 and 11 along with the connections shown in FIGS. 3, 4, 9A and 9B can be implemented integrally on one semiconductor substrate using conventional integrated circuit manufacturing techniques or on two superimposed semiconductor substrates with an array of pixel detectors on the first substrate and an array of pixel circuits on a second substrate mechanically attached to the first, for example by bump-bonding, with a one-to-one correspondence between pixel detectors and their corresponding pixel circuits.

In an exemplary embodiment of the invention for use in mammography, each block includes 80×240 pixels. Mammography is perhaps an application for the present imaging device with some of the most stringent requirements with regard to readout speed and storing capacity. For successful mammography, $10^4$ X-rays at 20 keV in one second for each pixel should be recorded. Where each pixel circuit has a storage capacity of $6 \times 10^7$ electrons, this means that more than ten thousand ($10^4$) X-rays can be accumulated on a pixel before the content of the pixel needs to be read out. It follows therefore that each pixel can for example be read of the order of 10 times per second or less, which equates to a pixel read out rate of 10 Hz. In a block with 80 rows of 240 pixels each, the readout time of the whole block is defined by the clock rate divided by 19200, which is the total number of pixels in the block. For a clock rate of 10 MHz, which is a typical clock rate, the whole block can be read at a rate of 520 Hz. As only 10 Hz is needed for mammography, it can be seen that the present embodiment of the invention is capable of handling intensities of up to fifty times that required for mammography. This redundancy offers, as will be explained shortly, the ability to multiplex together the outputs of many blocks (tiles) and minimize the total number of readout channels.

One aspect to the operation of the device is the dead time, which can be defined as the time it takes to reset each row after it has been read out. A row of pixels can be reset in 10 μsec. or less. During this time the pixels are inactive. Since in one second (which is typical for a mammogram) ten or less readout and reset operations are to be performed, this means that the total dead time is 0.0001 sec, or 0.01% dead time compared to the total time for which the imaging device needs to be active. The dead time with the present embodiment of the invention is insignificant therefore, and as good as no dead time. In order to appreciate how small this dead time is it is noted that the number of X-rays lost during this time (assuming $10^4$ X-rays per pixel per second) is $10^4 \times$ 0.0001 (approximately 1 X-ray per pixel). This is very much smaller than the quantum fluctuation limit (100) which is the statistical error for ten thousand X-rays. Accordingly this embodiment of the invention operates with a performance which matches the maximum possible statistically obtainable performance.

The example of a pixel circuit illustrated in FIG. 2 or FIG. 11 can be implemented with major dimensions less than 35 µm, so that the pixel cells may be 35 µm square or less. Each block thus has dimensions of 4 mm×12 mm and imaging surface having an area of, for example, 18 cm×24 cm can be formed from a mosaic of a few hundred tiles, where each tile corresponds to a block of, for example, 115×341 pixel cells.

Using a tiling approach for the generation of large imaging surfaces has the advantage of high manufacturing yield. It also provides the advantage of modularity so that if one tile fails, it is possible to replace the tile without having to replace the whole imaging surface. This makes a large imaging array economically viable.

Surprisingly, it is still possible to obtain good imaging quality using a tiling approach, despite the tiles comprising the blocks of m×n pixels cells and the associated circuitry and control electronics. Each tile will need a minimum of four, possibly five to ten external contacts. Also, on each tile at the edge of the active image area comprising the array of m×n pixel cells, there is some inactive space where the control and logic circuits of the tile are placed. In a preferred embodiment of the invention, the tiles are therefore placed in a mosaic as illustrated in FIG. 5.

For use in mammography, a detecting plane should be of the order of 30×30 cm². No dead space is allowed in the detecting plane. To achieve this with the arrangement shown in FIG. 5, the mosaic moves in two steps so that the whole surface to be imaged can be completely covered by accumulating three image frames. The tile shape can be substantially rectangular. The optimum length of the detecting (or active) area of one tile is equal to two times the total dead space at the long sides. As, however, estimated tile alignment accuracy of 50–100 µm demands some overlapping of the active area of the tiles, the tile dimensions may not correspond to the optimum dimensions. An example of the possible mosaic for a mammography application can comprises 621 tiles, with each tile having 41760 pixel cells each of 35×35 µm².

The movement of the image mosaic can be achieved using conventional mechanical arrangements with sufficient accuracy and speed. FIG. 5 illustrates that sufficient space has been provided for the electronics on each tile. The arrangement illustrated in FIG. 5 is optimized to allow a full surface image to be produced with the three images being collected, respectively before, between and after two steps of 12 mm. However, it will be appreciated that other embodiments may employ variations from the layout shown in FIG. 5 and that the technique disclosed here can be used in any application for accumulation of 100% of an image.

Figure 5:
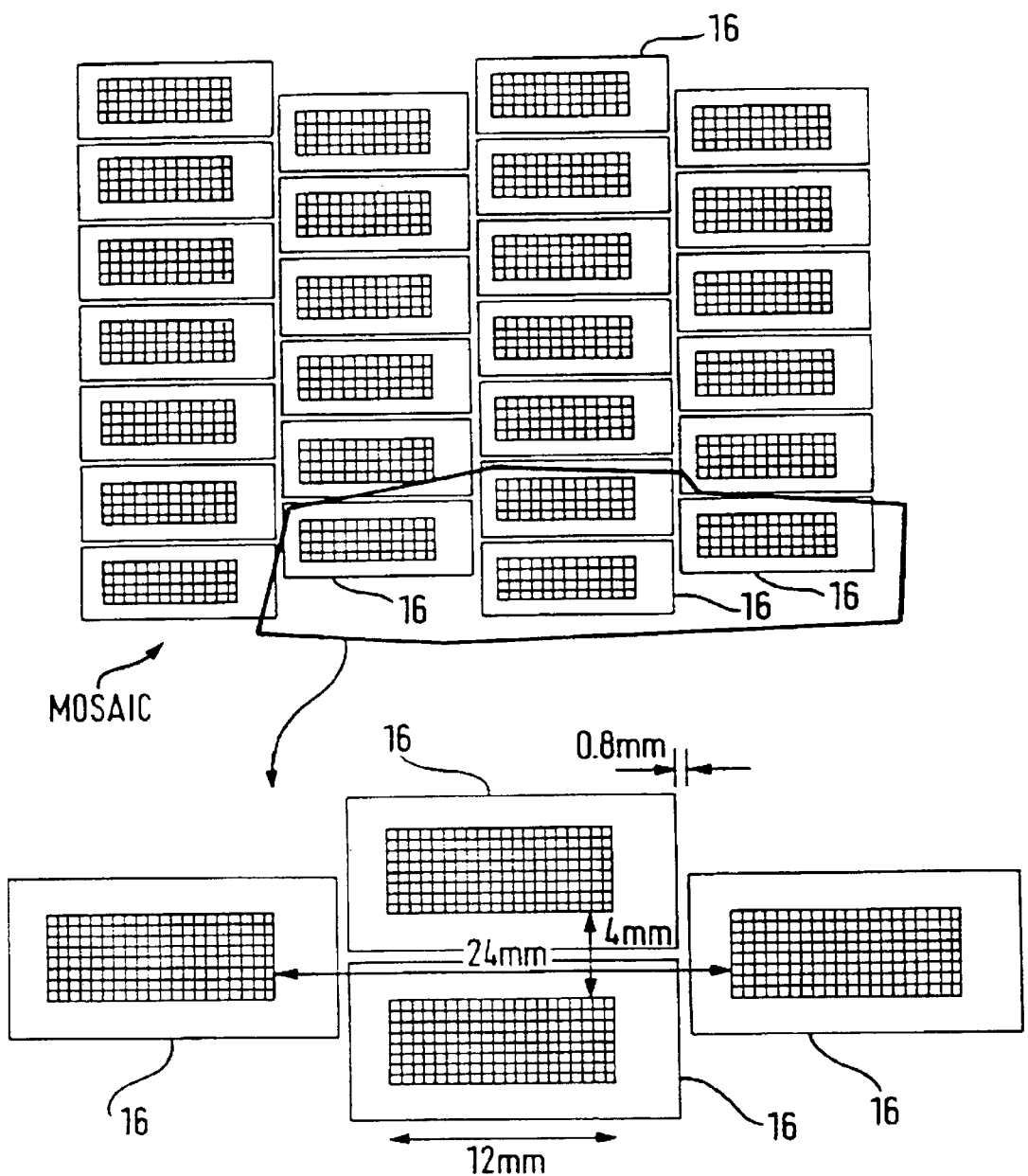
FIG. 5 is a schematic diagram showing a plurality of imaging devices tiled to form a mosaic of imaging devices in accordance with the invention.
Figure 5A:
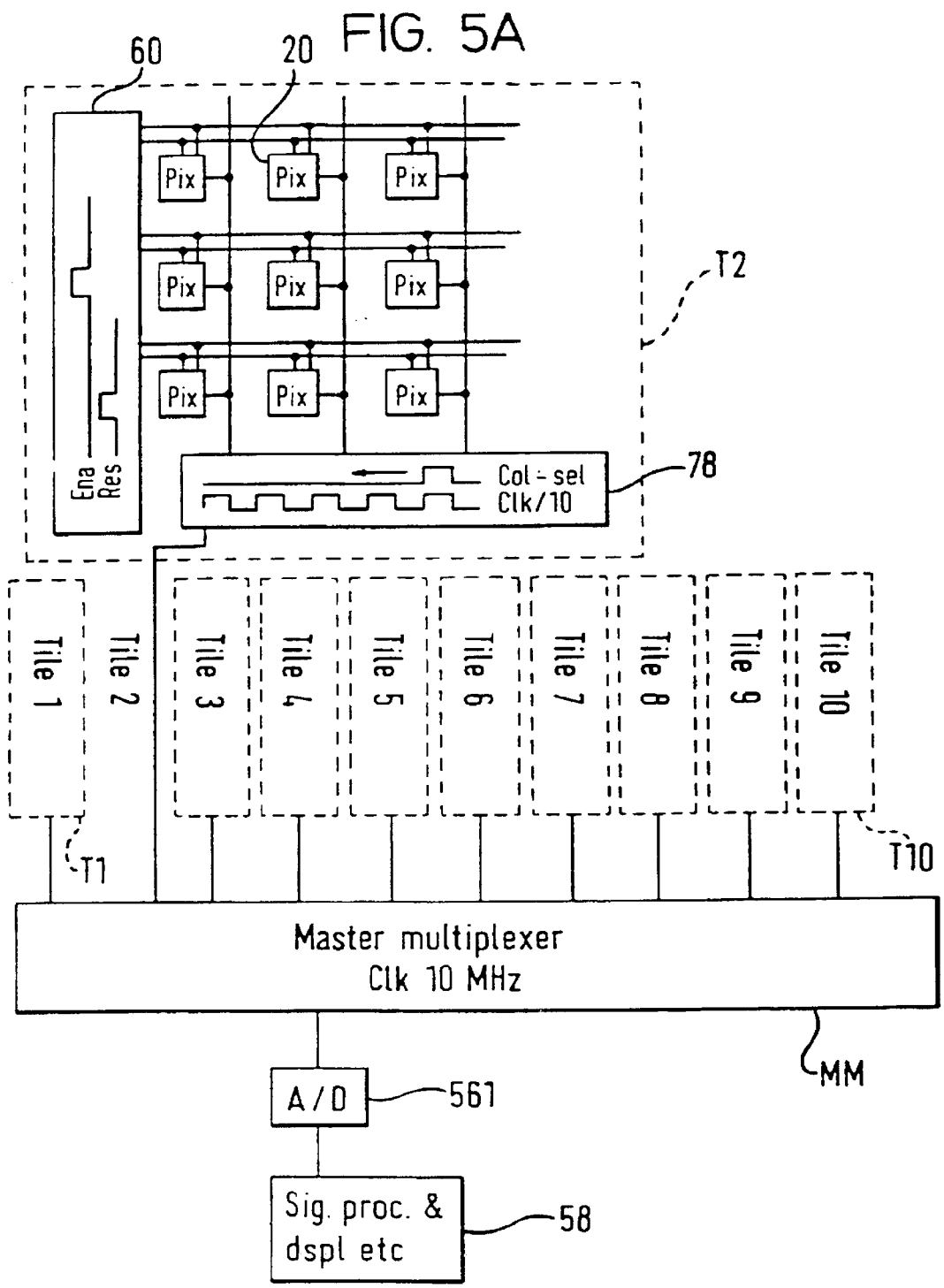
FIG. 5A is a schematic diagram of part of the control electronics for an embodiment of the invention comprising a plurality of imaging devices tiled to form a mosaic.

FIG. 5A illustrates a part of the control electronics for an embodiment of the invention comprising a mosaic of tiles, for example as shown in FIG. 5.

The basic control electronics for each tile (e.g. T2) corresponds generally to that shown in FIG. 3. However, rather than one ADC 56 being provided for each tile (as shown in FIG. 3), the outputs from a plurality of tiles (e.g. T1–T10) are connected via a master multiplexer MM (e.g., operating at a 10 MHz–100 MHz clock rate) to a common ADC 561 and from there to the signal processing logic, display etc. 58. The master multiplexer MM does not need to be placed on the tiles themselves, but can be located proximate thereto. The ADCs 561 are also not provided on the tiles but are preferably located nearby.

An advantage of the use of a master multiplexer is that the number of ADCs needed can be reduced, thus reducing the overall cost of the imaging system. As an alternative to FIG. 5A, tiles can be daisy-chained and read out in using a single, common ADC. The high resolution ADCs form an expensive part of the overall system, so that reducing their number can have a significant effect on the overall cost. In applications such as mammography, conventional X-rays, chest X-rays, etc. which can include a mosaic of several hundred tiles, a minimum of about nine ADCs are needed (i.e., just nine output channels) in order to provide the desired readout performance, even for high intensity applications. The circuitry in accordance with the invention enables tiles to be read out in a controlled manner such that an image can be accumulated by reading out the tiles a plurality of times. This is something that cannot be done with, for example, a CCD device. The multiple reading of the tiles enables a contrast improvement in the following manner. As an example consider that 5000 X-rays are incident on a detector pixel. If the storage capacity of the pixel can handle all 5000 X-rays, it might be decided to set the readout rate to correspond to a timing for the receipt of 5000 X-rays so that analogue charge values for all 5000 X-rays can be stored at a pixel and then the total accumulated charge value is read out. If a 10-bit ADC (i.e. 1024 grey scales) is used every 4.88 X-rays (i.e. 5000 X-rays/1024) will then corresponds to a different grey scale quantization. However, if a faster readout rate is used, for example at a timing corresponding to the reception of 1000 X-rays and the same ADC is used, then every 1000 X-ray/1024=0.97 corresponds to the grey scale quantization. From this schematic example, it can be seen that the grey scale resolution can be increased by simply reading out at a higher rate.

The techniques described immediately above and with reference to FIG. 5A enable an optimization between cost (more multiplexing and less ADCs) and image contrast (less multiplexing and more ADCs).

Figure 6A:
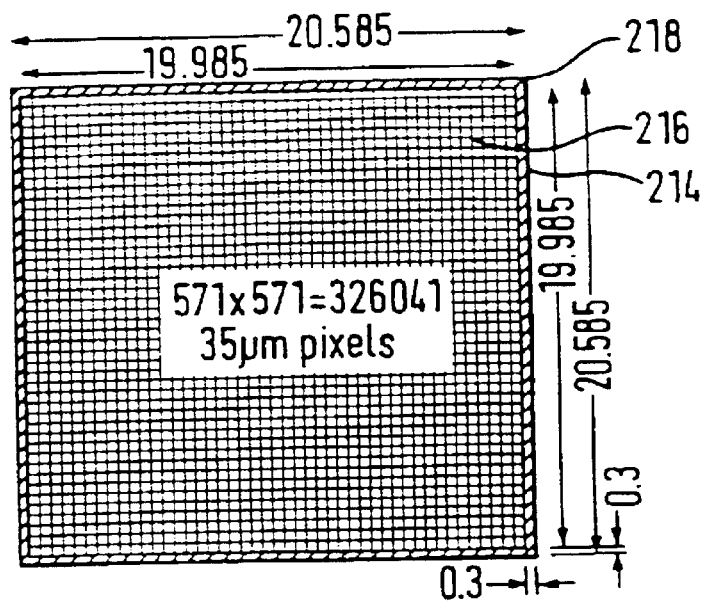
FIGS. 6A–6C are schematic diagrams of an imaging device in the form of a tile.
Figure 6B:
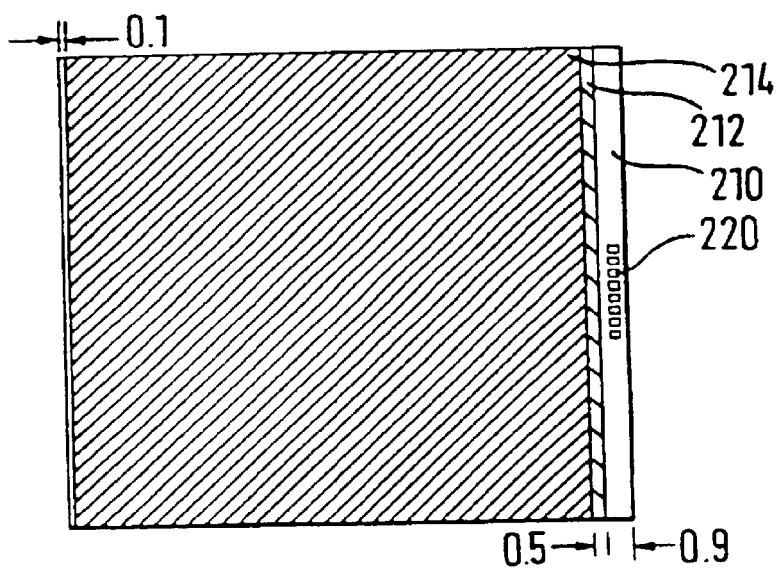
Figure 6C:
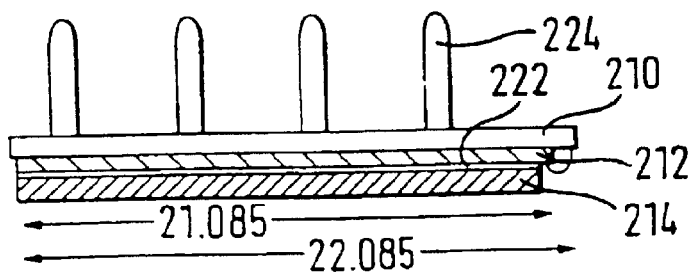

FIGS. 6A–6C illustrate in more detail the construction of one example of a tile having a layered construction including a hybrid supporting board 210, a silicon readout chip 212 mounted on the supporting board and a pixel detector layer 214 made of, for example, CdZnTe, CdTe, $HgI_2$, GaAs, Ge, Si or TlBr and bump bonded to the readout chip. FIG. 6A is a plan view of the pixel detector layer 214, which in this example has an active surface area 216 of 19.985 mm×19.985 mm. Around the active surface area of the pixel detector layer is an inactive area including a detector guard ring 218. FIG. 6B is a plan view of the detector layer mounted on the readout chip 212 and the supporting board 210. It will be appreciated that as well as the detector guard ring 218, the inactive area surrounding the active detector area also includes the edges of the readout chip 212 and the hybrid supporting layer 210 and space needed between the tiles. Wire bond pads 220 on the supporting layer or board 210 permit the electrical connection of the readout chip to circuitry on the board 210 and from there via a master back plane to image processing circuitry. FIG. 6C is a transverse cross-section of the tile showing the detector layer 214 connected at individual pixel locations to the readout chip by bump bonding 222. The supporting board is provided with an array of pins 224 for positioning and connecting the tile on a master back plane.

Figure 7C:
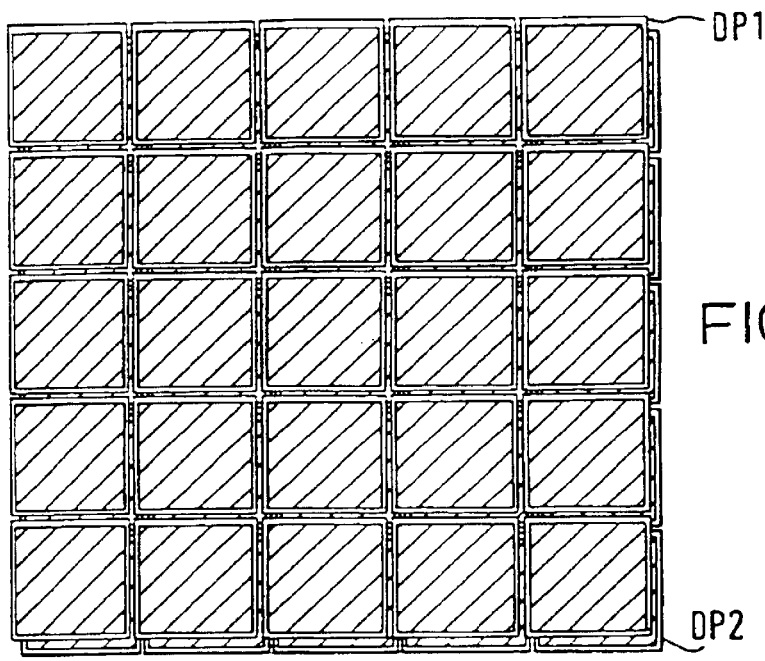

FIGS. 7A–7D illustrate an alternative to the provision of translation of a single detecting plane described with reference to FIG. 5, for example for an application in autoradiography where the surface to be imaged emits radiation rather than an external source. Consider an example of autoradiography where a sample is labelled with isotopes (e.g., C14, P32, P35, S32, I125, H3, etc). and is positioned as close as possible to an image detector (for example an imaging plane as illustrated in a FIG. 7A. Usually the sample rests on a thin mylar layer about 1.5 µm thick to avoid contamination. If the sample is located on the imaging plane, motion of the imaging plane as described with respect to FIG. 5 would not be possible. However, as a result of the inactive areas around the active areas of the tiles, the active imaging area of a single mosaic layer as in FIG. 7A will only provide about 85% coverage of the total area. FIG. 7A illustrates some of the dimensions for one example of a tile mosaic.

Figure 7D:
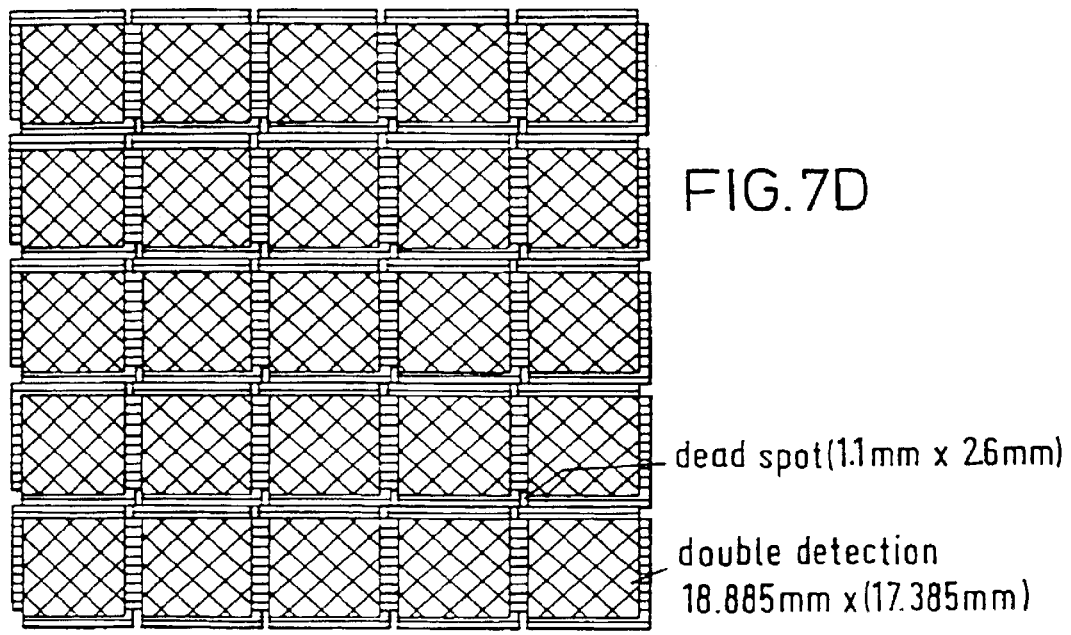

A solution to this problem as illustrated schematically in FIGS. 7B and 7C is to provide a sandwich of two imaging planes DP1 and DP2, above and below, respectively, the sample OS. The second imaging plane is brought as close as possible to the first imaging plane with the sample in between, with the imaging planes parallel to one another and slightly displaced with respect to one another. The positional accuracy can be as good as 1–2 µm. FIG. 7D represents the dead or inactive space between the active imaging areas in the arrangement shown in FIGS. 7B and 7C. The white spots represent the inactive areas with the cross hatched areas showing where the active areas overlap and the remaining hatched areas showing where only one active area overlies an area of the sample. In the particular example shown, and as identified in FIG. 7D, only 1.2% of the total area is inactive, 68.9% is imaged by both imaging planes (thus increasing efficiency as radiation is detected on both sides of the sample) and 29.9% imaged by only one plane. The 1.2% of inactive area can still be covered by occasionally lifting the upper plane and displacing it slightly along the diagonal, for example.

Ideally, in autoradiography, image surfaces as large as 42 cm×39 cm are needed. With tile dimensions as mentioned above, and 35 µm×35 µm pixels, 98.8% of the total area can be covered with 578 tiles. Only 40 ADCs or less would be needed if the tiles are multiplexed together as described elsewhere herein. Using these techniques a new total image could be generated and displayed every 3 seconds. This application of the invention can give practically 4π coverage of a sample increasing overall efficiency, real time imaging, a spatial resolution of 35 µm and a dynamic range of 6 orders of magnitude.

Thus this alternative arrangement which is suitable for use in applications where the object to be imaged includes a source of radiation, is to provide first and second detecting planes arranged substantially parallel to one another and spaced from one another with an object source to be imaged between the detecting planes. By arranging for the tiles of the respective imaging planes to be offset laterally with respect to one another, it is possible to obtain substantially complete imaging of an object where the radiation from the object is substantially the same towards both planes.

Other configurations of imaging devices can be used in different applications. For example, for computerized tomography applications, the imaging devices are arranged substantially tangentially around the periphery of a ring or part-ring to encircle or partially encircle a slice of an object to be imaged. The imaging devices could also be arranged substantially tangentially around the periphery of a plurality of rings or part-rings displaced from one another in the direction forming a common axis of said rings or part-rings in order to image a plurality of slices of the object. In other applications such as non-destructive testing and real time monitoring the imaging devices could be tiled together to form a mosaic matching the area and shape of an object to be imaged and/or to form a mosaic surrounding part or all of an object to be imaged.

Rather than arranging pixel cells in a largely rectangular array, in other embodiments of the invention, the imaging device could be configured as a slit with pixel cells arranged in a single column or a slot with pixel cells being arranged in a number of columns side by side. A slit or slot can be used in many applications such as radiographic body scanning, dental panoramic imaging, security scanning, etc. The use of a slot can also be used as an alternative to full field scanning with the advantage of lower cost because of the lower imaging surface. In the case of a slit or a slot having one or two rows of pixels the pixel circuits could be located to the side of the corresponding pixel detectors on the same semiconductor substrate rather than behind the pixel detectors on the same or a different semiconductor substrate. A very long uninterrupted slit (or slot) could be formed by placing a number of slit (or slot) tiles end to end. The tiles of adjacent columns can be displaced in the column direction so that during scanning there will be no inactive area corresponding to the inactive space between tiles. This is shown in FIG. 5. By locating the control electronics to the side of the pixel cells formed by the pixel detectors and the pixel circuits, the pixel cells can extend substantially right to the end of the individual slit (or slot) tiles. In this way a very long uninterrupted slit (or slot) can be manufactured in a very cost effective manner.

Returning to FIG. 1 the control electronics 24 include the processing and control circuitry described with reference to FIGS. 3 and 4, which is connected to the pixel cells 18 on the semiconductor substrate as represented schematically by the two-way arrow 22. The control electronics 24 enable the active circuits 20 associated with individual pixel cells 18 to be addressed (e.g., scanned) for reading out charge accumulated in the active circuits 20 at the individual pixel cells 18. The charge read out is supplied to Analogue to Digital Converters (ADCs) for digitization and Data Reduction Processors (DRPs) for processing the binary signal.

The processing which is performed by the DRPs can involve discriminating signals which do not satisfy certain conditions such as a minimum energy level. This is particularly useful when each readout signal corresponds to a single incident radiation event. If the energy corresponding to the measured signal is less than that to be expected for the radiation used, it can be concluded that the reduced charge value stored results from scattering effects. In such a case the measurement can be discarded with a resulting improvement in image resolution. Alternatively for pixels larger than 100 µm across, the discrimination can be carried out on each pixel circuit as mentioned earlier. In this case low energy hits are excluded while the rest are accumulated on the pixel circuits.

The control electronics 24 is further interfaced via a path represented schematically by the arrow 26 to an image processor 28. The image processor 28 includes data storage in which it stores the digital value representative of the charge read from each pixel cell along with the position of the pixel cell 18 concerned. For each pixel cell 18, each charge value read from the pixel cell is added to the charge value already stored for that pixel cell so that a charge value is accumulated. As a result, each image can be stored as a representation of a two-dimensional array of pixel values which can be stored, for example, in a database.

The image processor 28 can access the stored image data in the database to select a given image (all the array) or a part of the image (a sub-sample of the image array). The image processor 28 reads the values stored for the selected pixel positions and causes a representation of the data to be displayed on a display 32 via a path represented schematically by the arrow 30. The data can of course be printed rather than, or in addition to being displayed and can be subjected to further processing operations. Background and noise can be subtracted as a constant from each pixel charge value. This pedestal and/or background subtraction is possible if prior to image taking an "empty" image is acquired. For each pixel a background value is deduced and can be subtracted accordingly.

The operation of the image processor 28 will be described in more detail below.

Figure 12:
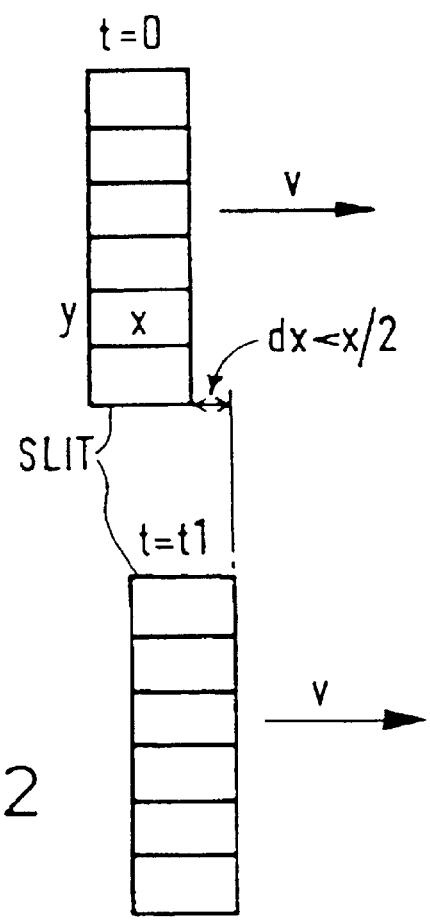
FIG. 12 illustrates an imaging technique in accordance with the invention using a slit- or slot-shaped imaging device.

FIG. 12 illustrates an imaging technique in accordance with the invention using an imaging device in accordance with the invention with a slit or slot of random accessible, active dynamic pixel cells. In accordance with this technique, the slit or slot is moved sideways at a constant speed v and is read out every $t_1-t_0$ time units.

In the example shown in FIG. 12, a slit with 6 pixels, each pixel having the dimensions (x,y). The constant movement is in the direction of the dimension x. If readout occurs at time $t_0$, then in accordance with this aspect of the invention, the slit should be allowed to move until a time $t_1$ and then be read out again. The distance moved, or scanned during the period $t_1-t_0$ is dx and should not be larger than half the pixel size in the direction of movement (i.e. dx←x/2). This technique improves the resolution along the axis of movement by a factor of two compared to full field imaging or conventional slit (slot) techniques. The reason for the improvement lies in the multiple sampling mode that is used and according to which if the slit (slot) frame is accumulated in short enough intervals (distance scanned must be shorter than half the pixel size), the underlying structure is 'sensed' with a resolution equal to the pixel size rather than twice the pixel size. Twice the pixel size is the effective resolution for a full field imaging plane or a slit (slot) that does not operate in the manner in accordance with this aspect of the invention. The above described technique can be used for example in dental panoramic imaging. The scan speed is typically 4 cm/sec and the slot has a width of 4 mm and a length of 8 cm. This translates to 80×1600 pixels with a 50 µm square pixel size. The whole image accumulation should last about 10 seconds. According to the current embodiment of the invention, the slot should be read out at least every 25 µm which means a slot readout rate of 1.6 kHz. If blocks of pixels of 80 columns by 20 rows of pixels and a clock frequency of 5 MHz are used, the block readout speed is $5\times10^6/(20\times80)=3.1$ kHz; much more than the 1 kHz needed.

When the slit (slot) technique is used the X-ray source should be set at a higher operating current or if possible the X-rays should be condensed from a full field area to the dimensions of the slit (slot). This is needed to keep the image accumulation time constant. In many cases this can be technically difficult and costly. An alternative to the single slit (slot) technique is a multi-slit (-slot) technique. In accordance with this variant multiple slits (slots) are positioned on a plane parallel to each other and with some constant distance between the longitudinal axis of the slits (slots). In this manner, if there are n slits (slots) and the total distance to be scanned is X cm, then each slit (slot) need only scan X/n cm. This makes less demands on the mechanics, but more importantly the X-ray source intensity needs to increase by only X/(n x slit (slot) width).

Various methods of operation of the imaging devices and systems in accordance with the invention will now be described. As mentioned above the devices and systems of the invention are aimed to provide imaging of high intensity radiation which is intended to be incident directly on the imaging devices. In embodiments of the invention, charge is accumulated (by storing charge values directly or voltage or current equivalents) in response to radiation hits with the charge value being directly and linearly related to the total energy of the incident radiation, rather than by counting numbers of points or events or pulses. Thus an ASID accumulates charge on the gates of transistors and/or capacitors (or other charge accumulating devices implemented on the pixel circuit) that account for most of the input node capacitance for each pixel circuit and each pixel detector, and an ASID has direct one to one access to all pixel cells. These two main features have a dramatic impact on performance. An ASID can accumulate about two orders of magnitude more charge than a CCD. An ASID also provides unambiguous imaging with less than a fraction of a percent inactive time. The electronic noise level is just about few hundred electrons.

Compared to conventional pulse counting semiconductor pixel detectors an ASID has no limitation on the intensity of the radiation (and/or light). Long image frame accumulation times (up to 1 second if needed) and very high dynamic range allow high intensity real time imaging without saturation.

As mentioned above with reference to FIG. 1, after the ADCs, there is an image processor 28 which stores the digital value representative of the charge read from each pixel cell along with the position of the pixel cell 18 concerned. For each pixel cell 18, each charge value read from the pixel cell is added to the charge value already stored for that pixel cell so that a charge value is accumulated. As a result, each image can be stored as a representation of a two-dimensional array of pixel values.

The image data can be stored, for example, in a database as a two-dimensional array for the image:

$$\text{Image } (1:N_{pixels}, 1:3)$$

where the first index includes $N_{pixels}$ items representing a pixel number on the imaging plane which runs linearly from one to a maximum pixel number $N_{pixels}$ and the second index includes three values, for the x and y coordinates and the charge value accumulated for each pixel, respectively. For each image a background/pedestal array can be subtracted. The background/pedestal pixel values can be accumulated for example just before image accumulation as a calibration image. This way calibration is provided for each pixel individually and not as a global constant for all pixels.

The image processor 28 access the stored image data in the database to select a given image (all the array) or a part of the image (a sub-sample of the image array) and causes a representation of the data to be displayed, printed, or processed further.

Preferably, before displaying, printing or further processing the image data, the image processor 28 finds the two extreme pixel charge values stored for the pixels selected and assigns these values to the two extremes of the grey or colour scale which can be used for displaying, printing or further processing of the image, as appropriate. The remaining charge values for the pixel positions can then be assigned an intermediate grey scale or colour value between these extreme values according to the charge deposited on the pixel. For example the grey scale value can be assigned to the charge values for individual pixels in accordance with the following equation:

Grey scale value of pixel i=

$$\text{Min}_{grey} + \frac{(i_{charge} - \text{Min}_{charge})}{(\text{Max}_{charge} - \text{Min}_{charge})} \times (\text{Max}_{grey} - \text{Min}_{grey})$$

The selection of a portion of the image to be zoomed can be achieved by means of conventional user input devices 36 via a data path represented schematically by the arrow 34, possibly interacting with the display 32 as represented schematically by the double arrow 38. The user input devices 36 can include, for example a keyboard, a mouse, etc.

The invention brings a number of advantages as a result of accumulating charge in an active circuit for each pixel cell.

The ability to accumulate the charge in the active circuits on the pixel cells and then selectively to read out the stored charge from individually addressable active circuits in one to one correspondence with the pixel cells completely resolves any ambiguities regarding the point of incidence of concurrently incident radiation.

As the charge can be built up over a period on individual active circuits, the readout speed need not be excessively high, with the result that, for example, software-based generation and processing of the image in real time is possible and indeed can be implemented inexpensively on readily available computer hardware.

For each portion of the captured image the contrast and resolution can be adjusted automatically and displayed on a full screen. Wherever there is a charge density variation between the pixel cells of an area of the image captured by the imaging device, features of the image can be resolved when that part of the captured image is displayed.

The dynamic range is effectively unlimited assuming that the charge from the charge storage device of the pixel cell active circuits is read and the charge storage device is reset repeatedly before the storage capacity of the charge storage device is exhausted. It is merely necessary to select the "refresh rate" of the active circuits, that is the frequency of reading out and resetting those circuits, to suit the storage capacity of the charge storage devices and the anticipated maximum radiation density. Thus, as more radiation creates more charge, this is stored in the active circuits of the pixel cells, then read out at appropriate intervals and digitized by the control electronics. After digitization, the charge has a known value that can be accumulated with existing digitized charge values of the same pixel. The only practical limitation is the maximum digital value which can be stored by the processing circuitry. However, even then the processing circuitry could be arranged to detect a value approaching the maximum possible value which can be stored and then to apply a scaling factor to the stored values of all pixel cells.

The invention enables real-time imaging. Once an image array has been created, even before irradiation starts, the image array can be updated continuously with new digitized charge values from the imaging device, which charge values are then added to the existing charge values of the respective pixel of the array and the accumulated charge values are displayed in real time.

Where a continuously updated image array is employed, this provides an efficient use of computer storage as detected radiation will not yield more image points, as is the case with some prior techniques, but instead yields higher charge values for the pixel cell positions concerned. In other words, the present invention enables the accumulation of radiation counts rather then generation of an ever increasing number of radiation hit points. An ASID can also be used for providing real time imaging where for every predefined time interval a new image frame is displayed. The inactive time between image frames is practically zero thus real time imaging is provided with maximum efficiency and at no expense of additional complexity in either the number of readout channels or the pixel circuits.

The present invention offers a way to minimize the effect of radiation scattered before entering the imaging device. When an imaging device is used in the manner described above, scattered rays will lead to a lower charge value being accumulated than would be the case if that radiation were directly incident. This is because the scattered rays will deposit less energy in the depletion zone of the pixel detector. Thus, when processing the accumulated charge, scattered radiation will have a much lower effect on the overall accumulated charge than direct radiation. By assigning an appropriate grey scale or colour value to lower values when displaying an accumulated image, it is possible to minimize the effect of the scattered radiation.

For applications with radiation intensities requiring less than the maximum achievable readout speed per pixel (kHz range), the present invention offers a way of excluding the effect of radiation scattered before entering the imaging device, which, if not excluded, will degrade the image resolution. The way that this can be done will now be explained. The charge created from each and every photon or charged radiation particle is first stored in the active circuits of the pixel cells and then read out. The control electronics digitizes the charge and the DRP can compare the digitized value to a threshold reference value. The reference value corresponds to the charge to be expected from incident radiation of the type in question, that is for example an X-ray of a given wavelength or from a charged radiation of a given energy. The digitized charge value is then excluded from further consideration if it is less than the reference value. This discrimination operation enables scattered rays to be eliminated from consideration. When inelastic scattering effects occur before the imaging plane while, for example, the radiation traverses an object under observation, the scattered radiation loses some of its energy before the imaging plane so that less charge is created in the depletion region of a pixel cell. Such effects are Compton scattering for photons and ionization scattering for charged particles.

On the other hand scattered rays can be excluded at any incoming intensities if this is done on the pixel circuits prior to charge accumulation. Applications such as gamma cameras and real-time angiography imaging need pixels of 100 $\mu$m or more across and there is adequate space on the pixel circuit for implementing the threshold cut-off.

An example of a method which enables a way of excluding the effect of radiation scattered, either coherently or incoherently, before entering the imaging device using a slot technique and a collimated radiation source such that it is adjusted to emit rays that are aimed at the imaging slot. The distance between the ray source and the object under observation, the distance between the object and the imaging slot and the width of the slot are optimized. These parameters can be used to define the geometry that minimizes detection of scattered rays. This is because the scattered rays 'see' a small phase space and have no reason to enter the thin imaging slot. This method is particularly powerful because it is based on geometry and does not require knowledge of the energy of the rays. If the rays have been scattered they will most likely miss detection whether they have been scattered incoherently and have lost some of their energy (Compton scattering) or coherently and have preserved all of their energy (Rayleigh scattering).

Figure 13:
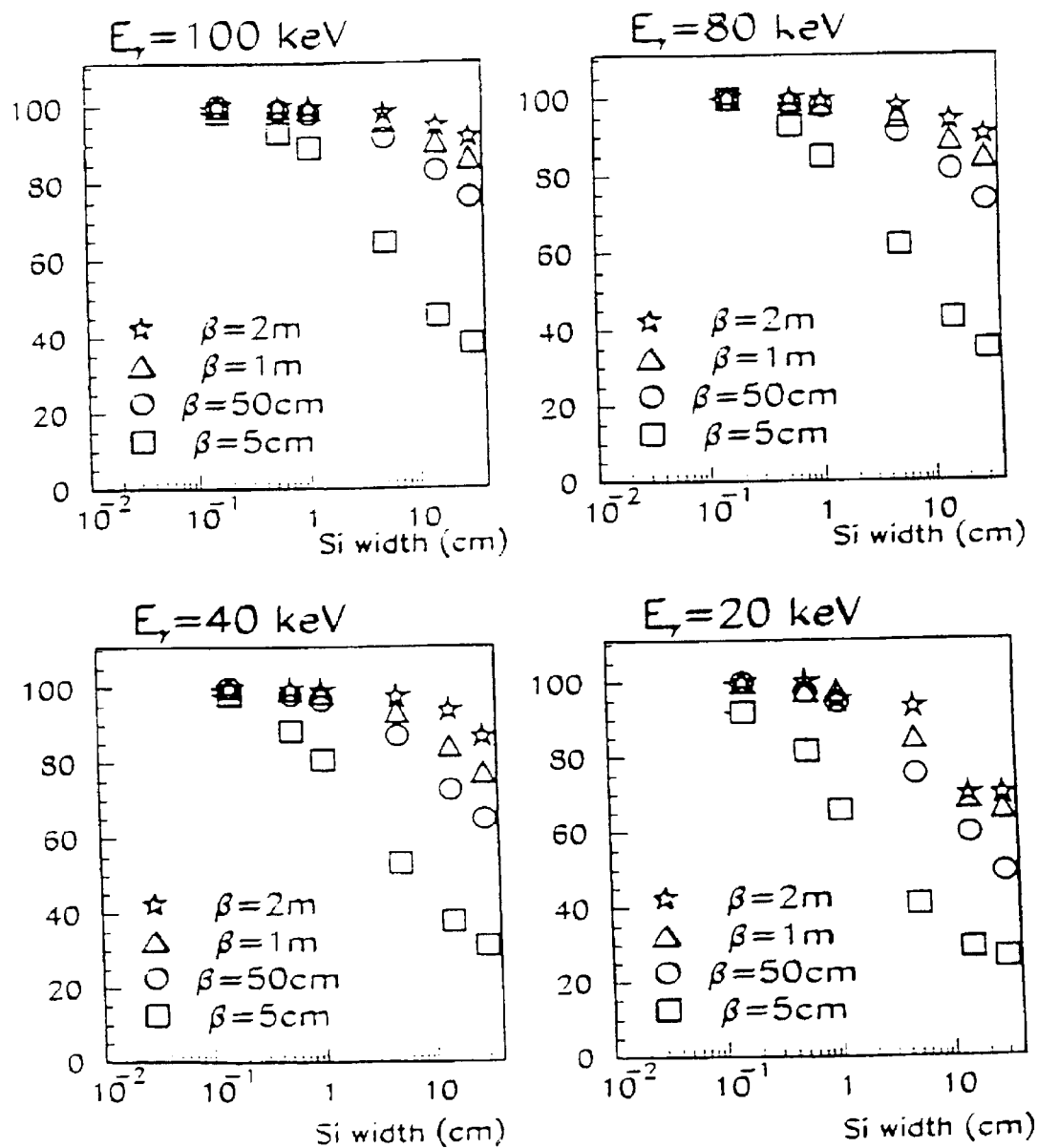
FIG. 13 illustrates the optimization of parameters for a slit- or slot-shaped imaging device to reduce the effects of scattering.

FIG. 13 illustrates, by way of example, the ratio of unscattered radiation that reaches the slit (slot) as a function of the slit (slot) width for four different photon energies and four different distances between the slit (slot) and the object under observation. For this example, water is assumed to be the object which causes scattering over 10 cm thickness. The semiconductor is assumed to be silicon. It is seen from the four curves that practically all scattering is excluded (100% vertical axis) at slot widths between 1 mm and 4 mm. This result is almost irrelevant to the distance between the slot and object (β in the FIG). If the slot width starts to be larger than 1–4 mm, then the results starts depending on β as well. Thus, for a given energy and object under consideration, the optimal slot width and the distance β between the slot and the object is determined such that the scattered rays will almost totally be excluded, thus dramatically improving the image resolution and contrast. This method enables the exclusion of coherently scattered rays, which could not otherwise be excluded as they have the same energy as the unscattered rays.

Imaging device design optimization in accordance with the invention can be carried out in an predetermined automated manner. Each material or compound chosen for the semiconductor substrate has a different response to incident radiation which depends on the physical properties of the material or compound, the radiation type and the radiation energy. A centre of gravity method is applied to the deposited electric signal at every step as incident radiation traverses the semiconductor substrate. This enables the best attainable resolution to be determined as a function of the above parameters. Thus the pixel size is determined. By correctly choosing the pixel size the signal to noise ratio can be maximized (because most of the signal is contained in one pixel) while the cost and device complexity is minimized. These results along with the expected sensitivity can be stored in a database and can be used to define the design parameters of the imaging plane of the imaging device, namely the pixel size and substrate thickness. Alternatively, a series of imaging planes compatible with a common set of control electronics and an image processor can be provided. An end user can then, before carrying out imaging, input a desired sensitivity to the image processor to cause this automatically to select an imaging plane with the correct specification.

Figure 14:
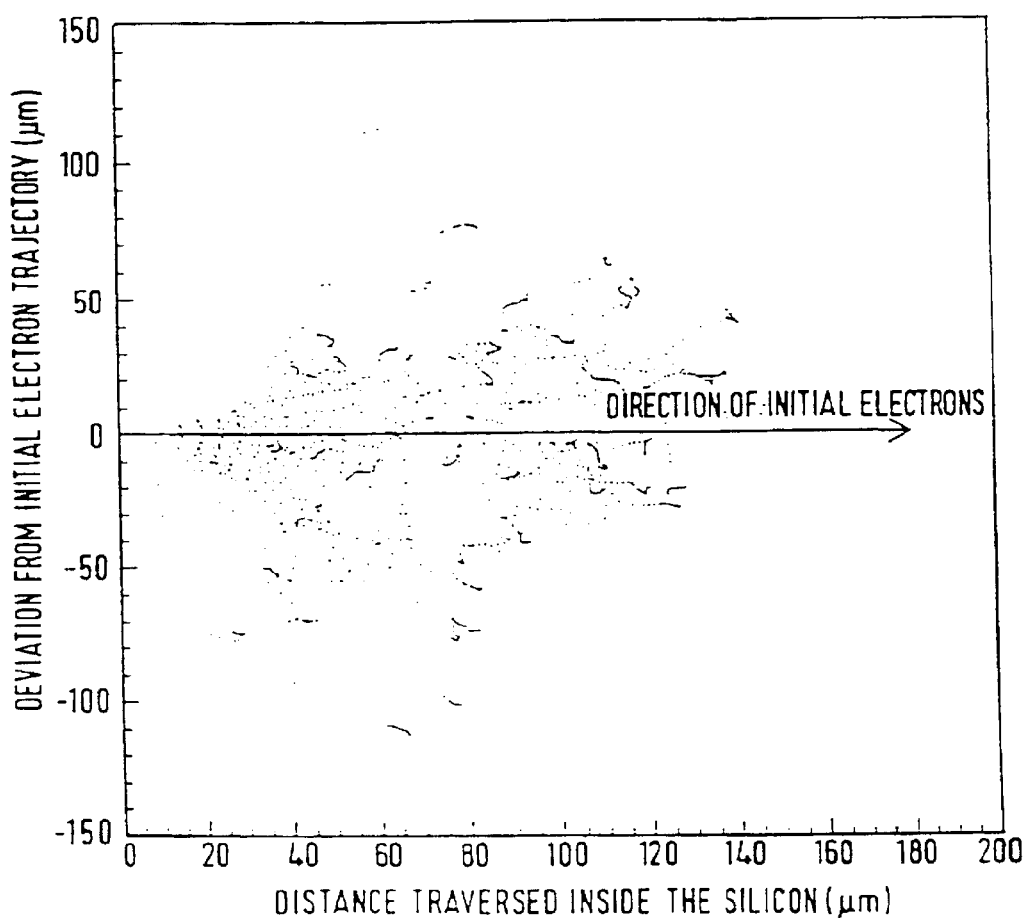
FIG. 14 is a schematic illustration of the passage of β-rays through silicon.

Consider, as an example, the use of silicon as the semiconductor substrate material. In biotechnology applications, isotopes such as 3H, 35S, 32P, 33P, 14C and 125I are used. These isotopes emit β radiation. Consider 35S, for example, which emits 170 keV charged radiation. FIG. 14 shows the passage of many such β-rays through silicon. If the centre of gravity method is applied, it is found that the resolution cannot be better than 32 μm. The pixel size can then be chosen to be greater than 32 μm in order to contain most of the electrical signal. The β radiation isotopes mentioned above are used in most biotechnology applications. In mammography, tomography, nuclear medicine, dental imaging, security systems and product quality control X-rays are used with energies between 10 keV–180 keV, and CdZnTe, CdTe and $HgI_2$ are suitable choices of semiconductors.

There are many biology applications that perform imaging with β radiation. Most often one of the following isotopes is used:

3H(18 keV), 14C(155 keV),35S(170 keV), 33P250 keV), 32P(1700 keV).

The precision requirements for these applications could be summarized as follows:

hybridization in situ requires ideally 10 μm;
hybridization on DNA, RNA and protein isolated or integrated requires ideally better than 300 μm;
Sequences of DNA require ideally 100 μm.

An imaging device in accordance with the invention can meet the above requirements. In addition the excellent efficiency (practically 100%) of imaging devices in accordance with the invention can reduce the time for obtaining the results from days or months to hours. Since the imaging is done in real time a biologist can see the results while they are being accumulated. Software and statistical methods of analysis can be used for interpreting these results.

In mammography the X-rays used have typically energy from 10 keV to 30 keV. The X-ray source is placed behind the object under observation which absorbs part of the X-rays and lets the rest through. The X-rays that arrive at the imaging plane are consequently photo-absorbed and create an electrical signal from which the point of incidence is determined. The charge density distribution effectively defines the image, which, with on-line conventional processing can be coloured, zoomed and analyzed with maximum image contrast and resolution. With 0.5–1 mm thick active CdZnTe, CdTe or $HgI_2$ pixels the efficiency is almost 100% and the dose needed can be reduced drastically. The resolution for mammography can be better than 30 μm and organic structures of that size are revealed.

In nuclear medical diagnosis an isotope emitting X-rays at the range of 150 keV (such as, for example, $Tc^{99}$ with 6 hours half life) is injected to the human body and concentrates to certain areas that are imaged. The radiation is emitted isotropically and around the human body collimators filter away unwanted directions thus making projections of a point to different planes. According to an example of the current invention the ASID, made for example of CdZnTe, CdTe, $HgI_2$, InSb, Ge, GaAs or Si, can be placed in front of and around the human brain replacing existing imaging planes.

In dental operations imaging is performed with X-rays at energies of 40 keV-100 keV and imaging areas around 15 $cm^2$ to 25 $cm^2$ are needed. Dental panoramic imaging using the slit/slot technique described above thus forms a preferred application of the invention. Suitable semiconductors are as described above.

Yet another possible application of the invention is non-destructive industrial evaluation and product quality control. Depending on the inorganic object that is observed a different X-ray energy is chosen so as to optimize resolution with high contrast and efficiency. X-ray energies in the range 20 keV–180 keV may be used. The image of a product or a structure is automatically compared to an ideal image of the same product or structure and various levels of severity may trigger different actions that give feedback to the production line.

An ASID and the methods described above can find application in a wide range of applications, including conventional X-rays, for chest X-rays, for X-ray mammography, for X-ray tomography, for computerized tomography, for spiral computerized tomography, for X-ray bone densiometry, for γ-ray nuclear radiography, for gamma cameras for single photon emission computerized tomography (SPECT), for positron emission tomography (PET), for X-ray dental imaging, for X-ray panoramic dental imaging, for β-ray imaging using isotopes for DNA, RNA and protein sequencing, hybridization in situ hybridization of DNA, RNA and protein isolated or integrated and generally for β-ray imaging and autoradiography using chromatography and polymerars chain reaction, for X-ray and γ-ray imaging in product quality control, for non-destructive testing and monitoring in real-time and online, for security control systems and for real-time (motion) imaging using radiation.

It will be appreciated that the size of the pixel cells and the number of pixel cells which can be implemented on a single semiconductor detector will depend on the particular semiconductor integration technology used. Thus, although particular examples of sizes and component values have been given, the invention is not limited thereto and is intended to include changes in those dimensions and values as are possible with current such technology and will be possible with future technology. Also, it will be appreciated that the actual circuits shown, for example the pixel circuit 20 shown in FIGS. 2, 8 and 11 the connection lines and control circuitry illustrated in FIGS. 3, 4 and 9, are merely examples of possible circuits and that many modifications and additions are possible within the scope of the invention.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

What is claimed is:

1. A semiconductor radiation imaging device for imaging high-energy radiation, comprising an array of pixel cells including an array of pixel detectors which directly generate charge in response to incident radiation and a corresponding array of individually addressable pixel circuits, wherein each pixel circuit is associated with a respective pixel detector for accumulating charge directly resulting from radiation incident on said pixel detector and comprises threshold circuitry and charge accumulation circuitry, said threshold circuitry being configured to discard radiation hits on said pixel detector below a predetermined threshold and said charge accumulation circuitry being configured to accumulate charge directly resulting from a plurality of successive radiation hits on said respective pixel detector at or above said predetermined threshold.

2. The semiconductor radiation imaging device of claim 1, wherein each of said pixel circuits further includes readout circuitry for reading out the accumulated charge from said charge accumulation circuitry and reset circuitry for resetting said charge accumulation circuitry, said charge accumulation circuitry having a capacitance forming substantially a total capacitance of a pixel cell formed by said pixel circuit and its corresponding pixel detector.

3. The semiconductor radiation imaging device of claim 1, further comprising control electronics including addressing logic for individually addressing a pixel circuit, said control electronics configured to read accumulated charge from said pixel circuit and selectively to reset said pixel circuit, and an analog-to-digital converter for converting said accumulated charge to a digital charge value.

4. The semiconductor radiation imaging device of claim 2, wherein said charge accumulation circuitry has a charge storage capacitance value and dynamic range sufficient to store at least 1.8 million electrons prior to being read out or reset.

5. The semiconductor radiation imaging device of claim 2, wherein said charge accumulation circuitry has a charge storage capacitance value and dynamic range sufficient to store 6 million electrons prior to being read out or reset.

6. The semiconductor radiation imaging device of claim 2, wherein said charge accumulation circuitry can store 25 million electrons prior to being read out or reset.

7. The semiconductor radiation imaging device of claim 2, wherein said charge accumulation circuitry can store 50 million electrons prior to being read out or reset.

8. The semiconductor radiation imaging device of claim 2, wherein said charge accumulation circuitry can store 60 million electrons prior to being read out or reset.

9. The semiconductor radiation imaging device of claim 2, wherein said charge accumulation circuitry comprises a charge storage device.

10. The semiconductor radiation imaging device of claim 1, wherein each pixel circuit further comprises a first transistor, a second transistor and an output line, said first transistor acting as said charge accumulation circuit and said second transistor acting as a readout switch, said pixel circuit being responsive to an enable signal to couple said first transistor to said output line for outputting accumulated charge.

11. The semiconductor radiation imaging device of claim 1, further comprising a first semiconductor substrate including said array of pixel detectors and a second semiconductor substrate including said array of pixel circuits.

12. The semiconductor radiation imaging device of claim 1, further comprising a semiconductor substrate including said array of pixel detectors and said array of pixel circuits.

* * * * *